United States Patent
Hong et al.

(10) Patent No.: US 11,435,797 B2
(45) Date of Patent: Sep. 6, 2022

(54) MANUFACTURING METHOD OF POWER MODULE

(71) Applicant: Delta Electronics (Shanghai) Co., Ltd., Shanghai (CN)

(72) Inventors: Shouyu Hong, Shanghai (CN); Yiqing Ye, Shanghai (CN); Kai Lu, Shanghai (CN); Qingdong Chen, Shanghai (CN); Le Liang, Shanghai (CN); Jianhong Zeng, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 56 days.

(21) Appl. No.: 17/199,367

(22) Filed: Mar. 11, 2021

(65) Prior Publication Data

US 2021/0200285 A1    Jul. 1, 2021

Related U.S. Application Data

(60) Division of application No. 16/238,235, filed on Jan. 2, 2019, now Pat. No. 11,036,269, which is a (Continued)

(30) Foreign Application Priority Data

Sep. 2, 2014  (CN) .......................... 201410442972.6
Oct. 26, 2018  (CN) .......................... 201811257942.2

(51) Int. Cl.
*G06F 1/26*    (2006.01)
*G06F 1/20*    (2006.01)

(52) U.S. Cl.
CPC . *G06F 1/26* (2013.01); *G06F 1/20* (2013.01)

(58) Field of Classification Search
CPC ..................................... G06F 1/20; G06F 1/26
See application file for complete search history.

(56) References Cited

U.S. PATENT DOCUMENTS

| | | |
|---|---|---|
| 3,660,726 A | 5/1972 | Ammon et al. |
| 4,984,059 A | 1/1991 | Kubota et al. |

(Continued)

FOREIGN PATENT DOCUMENTS

| | | |
|---|---|---|
| CN | 1332512 A | 1/2002 |
| CN | 1684350 A | 10/2005 |

(Continued)

*Primary Examiner* — Paul B Yanchus, III
(74) *Attorney, Agent, or Firm* — Kirton McConkie; Evan R. Witt

(57) ABSTRACT

A power module and a manufacturing method thereof are disclosed. The power module includes a substrate, a power device, a leading component and a molding component. The substrate includes a first side, a second side and a conductive wire. The power device is disposed on the substrate and electrically connected with the conductive wire. The leading component is disposed on the substrate and includes a first horizontal portion and a vertical portion connected with each other. The vertical portion is electrically connected with the conductive wire. The leading component includes a first contact surface and a second contact surface, which are non-coplanar. The molding component is disposed on the substrate and covers at least portion of the substrate and at least portion of the leading component. The first contact surface and the second contact surface are uncovered by the molding component.

7 Claims, 25 Drawing Sheets

Related U.S. Application Data continuation-in-part of application No. 15/952,224, filed on Apr. 12, 2018, now Pat. No. 10,877,534, which is a division of application No. 14/840,063, filed on Aug. 31, 2015, now Pat. No. 9,977,476.

(56) References Cited

U.S. PATENT DOCUMENTS

| | | |
|---|---|---|
| 6,496,377 B1 | 12/2002 | Happ et al. |
| 7,068,515 B2 | 6/2006 | Harris et al. |
| 8,587,963 B2 | 11/2013 | Nan et al. |
| 9,622,373 B1 | 4/2017 | Sarti |
| 10,447,166 B2 | 10/2019 | Zeng et al. |
| 10,877,534 B2 | 12/2020 | Zeng |
| 2002/0131258 A1 | 9/2002 | Inoue et al. |
| 2005/0189566 A1 | 9/2005 | Matsumoto et al. |
| 2007/0024369 A1 | 2/2007 | Cao |
| 2008/0052551 A1 | 2/2008 | Chapuis et al. |
| 2008/0101025 A1 | 5/2008 | Harris et al. |
| 2008/0158841 A1 | 7/2008 | Inagaki et al. |
| 2008/0231233 A1 | 9/2008 | Thornton |
| 2010/0093132 A1 | 4/2010 | Elbanhawy et al. |
| 2010/0105251 A1* | 4/2010 | Hiew .................. H05K 5/0282 156/242 |
| 2011/0080102 A1 | 4/2011 | Ge et al. |
| 2011/0157947 A1 | 6/2011 | Lo et al. |
| 2012/0173892 A1 | 7/2012 | Tong et al. |
| 2013/0229841 A1 | 9/2013 | Giuliano |
| 2014/0198454 A1 | 7/2014 | Yuan et al. |
| 2014/0306674 A1 | 10/2014 | Kondou et al. |
| 2015/0070940 A1 | 3/2015 | Sato et al. |
| 2015/0245531 A1 | 8/2015 | Meinecke et al. |
| 2016/0013719 A1 | 1/2016 | Babazadeh et al. |
| 2016/0062428 A1 | 3/2016 | Zeng et al. |
| 2016/0156201 A1 | 6/2016 | Park |
| 2016/0160828 A1 | 6/2016 | Betscher et al. |

FOREIGN PATENT DOCUMENTS

| | | |
|---|---|---|
| CN | 101119035 A | 2/2008 |
| CN | 101465743 A | 6/2009 |
| CN | 101651031 A | 2/2010 |
| CN | 101895191 A | 11/2010 |
| CN | 101777844 B | 4/2012 |
| CN | 103107777 A | 5/2013 |
| CN | 103596365 A | 2/2014 |
| CN | 103824853 A | 5/2014 |
| CN | 103872036 A | 6/2014 |
| CN | 103872919 A | 6/2014 |
| CN | 104038070 A | 9/2014 |
| CN | 104111715 A | 10/2014 |
| CN | 104253536 A | 12/2014 |
| CN | 104638944 A | 5/2015 |
| CN | 205004324 U | 1/2016 |
| CN | 105449987 A | 3/2016 |
| CN | 105790586 A | 7/2016 |
| CN | 105990265 A | 10/2016 |
| CN | 105990266 A | 10/2016 |
| CN | 106024763 A | 10/2016 |
| CN | 106026350 A | 10/2016 |
| CN | 106373932 A | 2/2017 |
| CN | 107452694 A | 12/2017 |
| CN | 108022899 A | 5/2018 |
| GB | 2399684 A | 9/2004 |
| JP | 2005235816 A | 9/2005 |
| TW | M253836 U | 12/2004 |
| TW | 200534570 A | 10/2005 |
| TW | 2015-5345 A | 2/2015 |

* cited by examiner

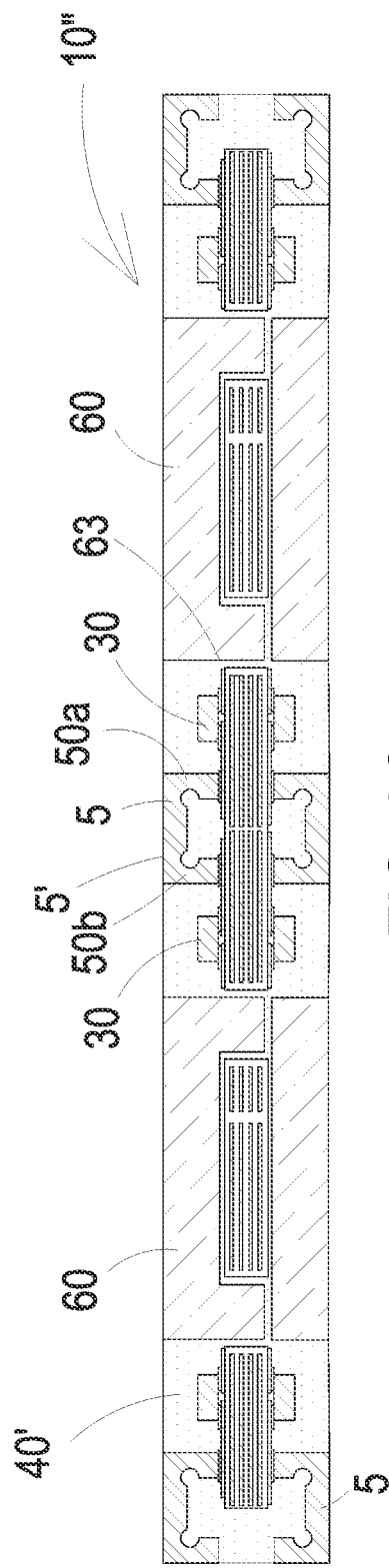
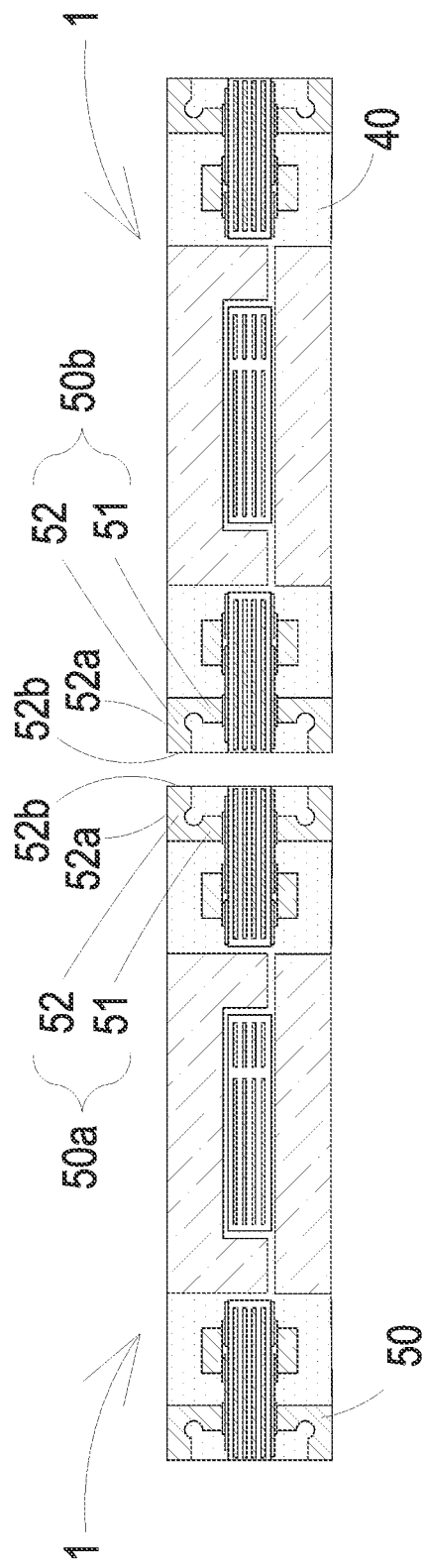
FIG. 2C
FIG. 2D

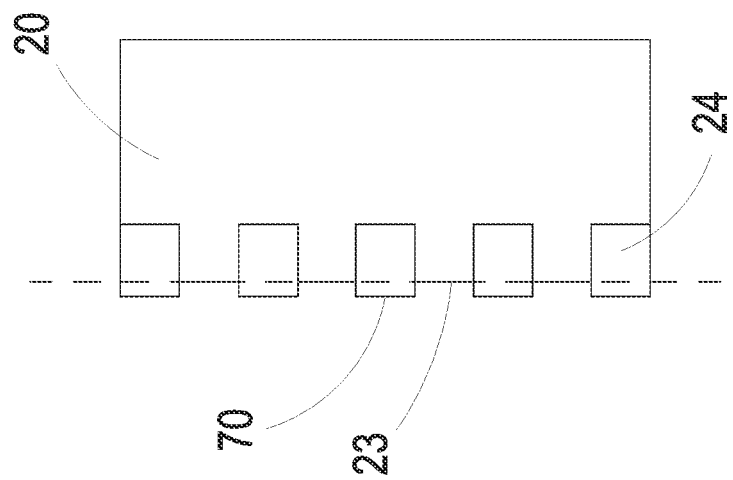
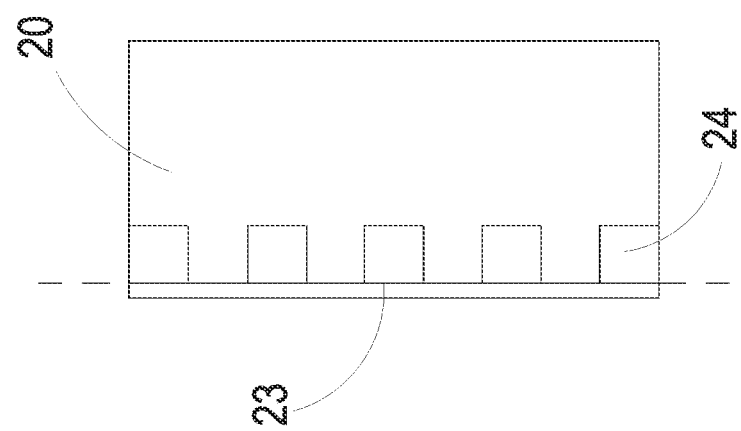

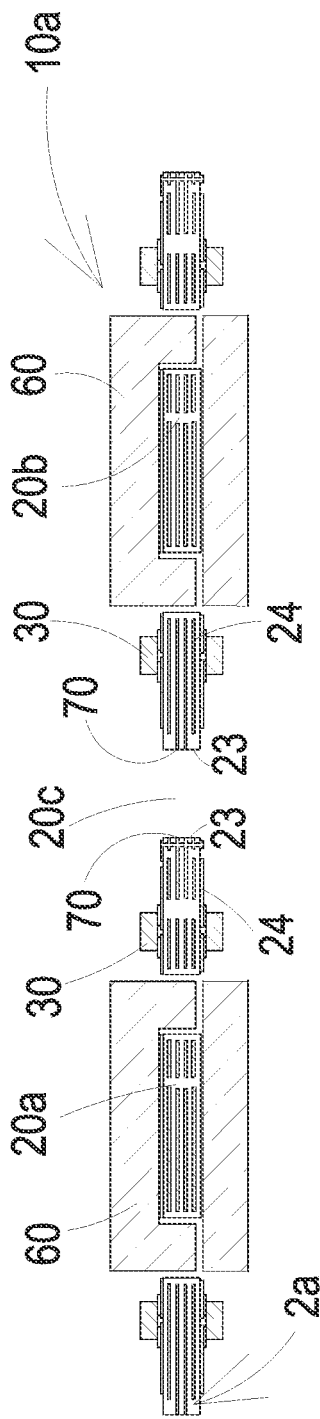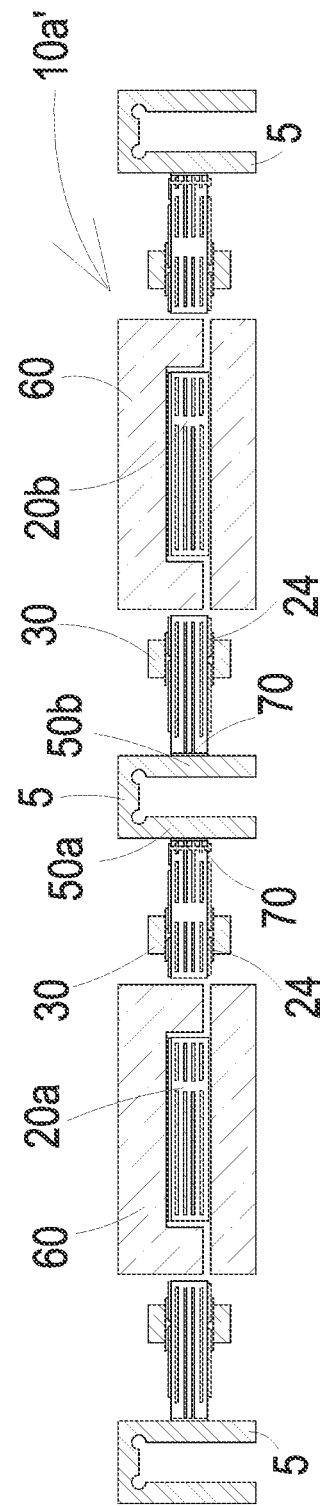

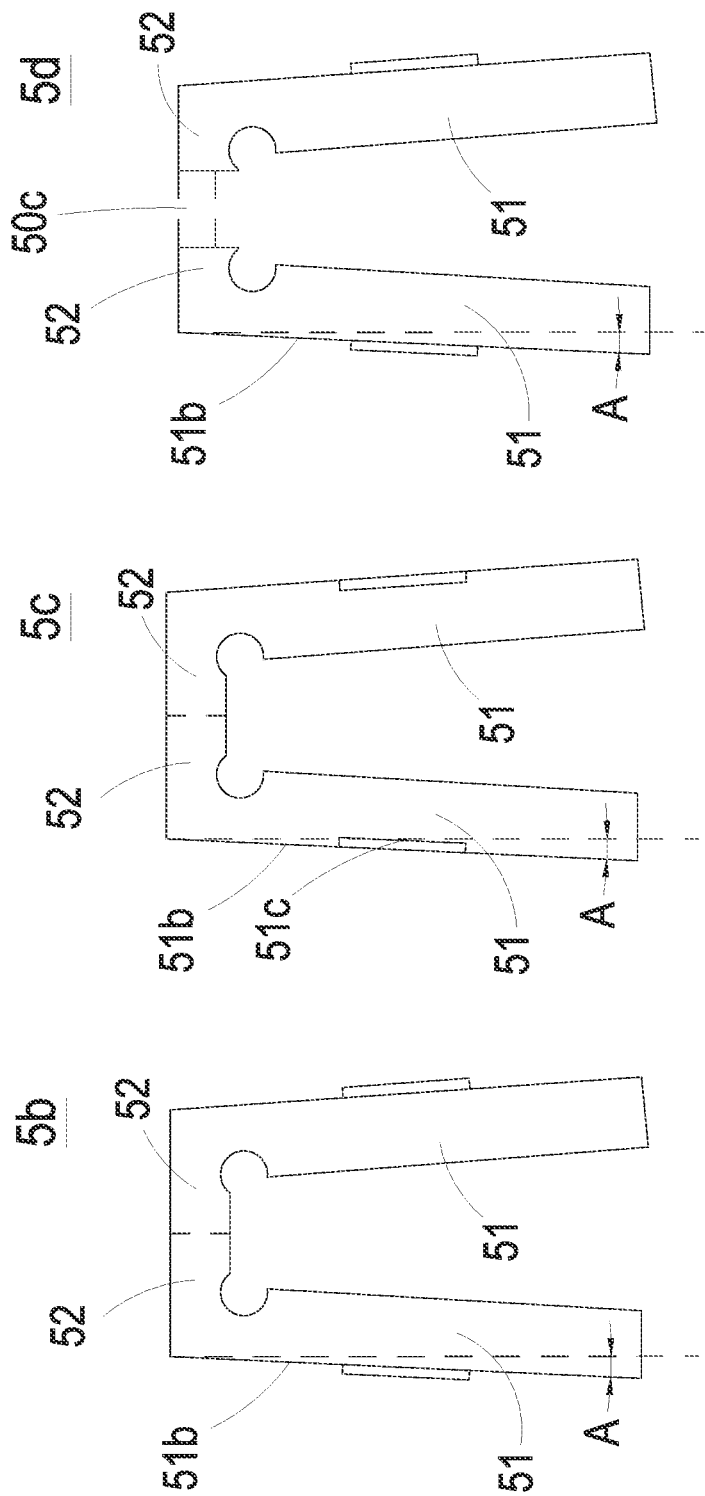

MANUFACTURING METHOD OF POWER MODULE

CROSS-REFERENCE TO RELATED APPLICATION

This application is a divisional application of U.S. application Ser. No. 16/238,235 filed on Jan. 2, 2019 and entitled "POWER MODULE AND MANUFACTURING METHOD THEREOF", which claims priority to China Patent Application No. 201811257942.2, filed on Oct. 26, 2018. In addition, U.S. application Ser. No. 16/238,235 is a continuation-in-part application of U.S. application Ser. No. 15/952,224 filed on Apr. 12, 2018, and entitled "POWER SUPPLY APPARATUS", which is a divisional application of U.S. application Ser. No. 14/840,063 filed on Aug. 31, 2015, and entitled "POWER SUPPLY APPARATUS". The entire contents of the above-mentioned patent applications are incorporated herein by reference for all purposes.

FIELD OF THE INVENTION

The present disclosure relates to a power module, and more particularly to a power module having an optimized pin assembly and a manufacturing method thereof.

BACKGROUND OF THE INVENTION

Conventional power modules, such as a DC/DC converter, typically include power devices, magnetic components, capacitors, substrate and pins. The substrate is used to carry the power devices, the capacitors, and the magnetic components. The substrate is also used to make the necessary interconnection between the said components. The conventional power module includes pins, which are wave-shaped pins, and have the advantages of large current-carrying capacity, but have a large footprint. In addition, in order to ensure the convenience of the manufacturing process, the height of the wave-shaped pins are generally less than twice the length or width, and it must be ensured that the minimum length or the minimum width is not less than 1 mm. However, these conditions are not conducive to reduce the size of the power module, and also have a significant adverse effect of increasing the power density.

Alternatively, the conventional power module has terminals made with Cu metallization, wherein the power module is encapsulated with molding compound and has a position at the sidewall thereof for fanning out the terminals, so that the Cu wiring layer in the substrate of the power module can be fanned out to accomplish the terminals by metallization. Due to the metallization process, the accomplished metal layer is typically thin, and it results to increase the losses. On the contrary, if the thickness of the metal layer is increased, the process cost will be higher and it results to decrease the competitiveness in the market.

Therefore, there is a need of providing an improved power module in order to achieve better performance. Good and stable conduction performance is achieved through leading components and it also benefits to achieve the high efficiency and the high power density.

SUMMARY OF THE INVENTION

In accordance with an aspect of the present disclosure, there is provided a manufacturing method of a power module. The manufacturing method includes steps of (a) providing a substrate panel, wherein the substrate panel includes a plurality of substrates and the plurality of substrates are arranged in an array, wherein each substrate includes a first side, a second side and a conductive wire, and the first side and the second side are opposite to each other, wherein the plurality of substrates includes a first substrate and a second substrate; (b) providing at least one leading unit and a plurality of power devices disposed on the substrate panel, wherein the plurality of power devices are disposed on and corresponding to the plurality of substrates, and each power device is electrically connected with the conductive wire of the corresponding substrate, wherein the at least one leading unit includes at least two of a first leading component and a second leading component connected adjacent to each other, and the first leading component and the second leading component both include a first horizontal portion and a vertical portion, wherein the first horizontal portions of the first leading component and the second leading component are electrically connected to the conductive wires of the adjacent two of the first substrate and the second substrate through the corresponding vertical portions, respectively; (c) forming a molding layer disposed on the substrate panel to cover at least portion of the first leading component and at least portion of the second leading component; and (d) separating the substrate panel, the at least one leading unit and the molding layer, wherein the molding layer is separated into a plurality of molding components, and the first leading component and the second leading component are separated.

The above contents of the present disclosure will become more readily apparent to those ordinarily skilled in the art after reviewing the following detailed description and accompanying drawings, in which:

BRIEF DESCRIPTION OF THE DRAWINGS

FIGS. 2A to 2D are schematic cross-sectional views illustrating a manufacturing process for producing two power modules of the first embodiment of the present disclosure;

FIGS. 7A and 7B show a first exemplary art to produce the connection portion of the present disclosure;

FIGS. 10A to 10D are schematic cross-sectional views illustrating a manufacturing process for producing two power modules of the second embodiment of the present disclosure;

FIG. 12A is a lateral view illustrating a third exemplary structure of the leading unit of the present disclosure;

FIG. 12B is a lateral view illustrating a fourth exemplary structure of the leading unit of the present disclosure;

FIG. 12C is a lateral view illustrating a fifth exemplary structure of the leading unit of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
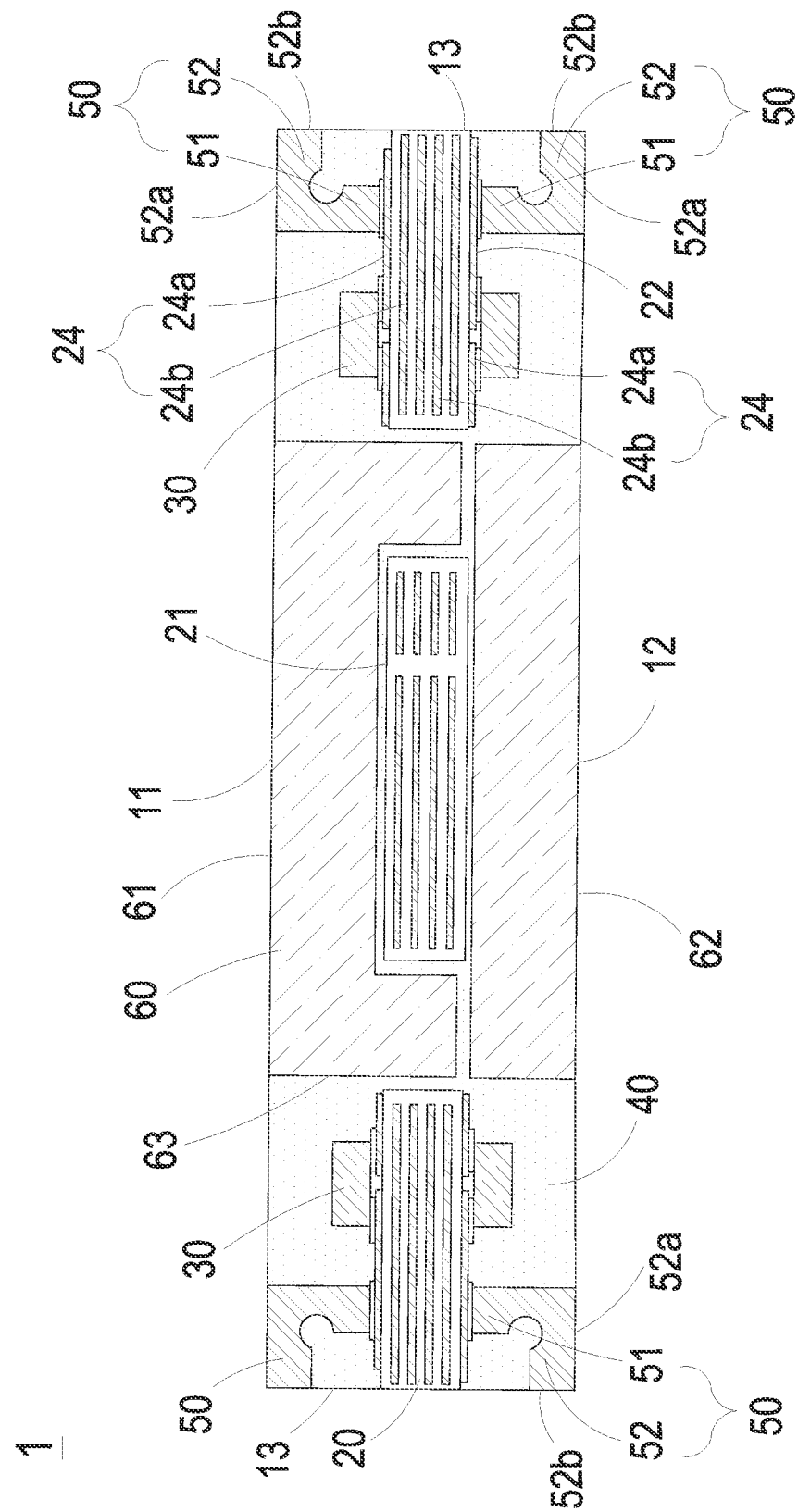
FIG. 1 is a schematic cross-sectional view illustrating a power module according a first embodiment of the present disclosure.

FIG. 1 is a schematic cross-sectional view illustrating a power module according a first embodiment of the present disclosure. In the embodiment, the power module 1 includes a substrate 20, at least one power device 30, a molding component 40 and at least one leading component 50. The substrate 20 includes a first side 21, a second side 22 and a conductive wire 24. The first side 21 and the second side 22 of the substrate 20 are opposite to each other. The substrate 20 can be for example a printed circuit board (PCB), the conductive wire 24 is the part of copper layout of substrate 20 and may be in form as a PCB wiring, but the present disclosure is not limited thereto. The power devices 30 are disposed on the substrate 20. The power devices 30 are electrically connected with the conductive wire 24. The at least one power device 30 can be disposed on the first side 21 and/or the second side 22 of the substrate 20. In the embodiment, there are four power devices 30 disposed on the first side 21 and the second side 22, respectively, but the present disclosure is not limited thereto. The leading components 50 are disposed on the substrate 20. Each leading component 50 includes a first horizontal portion 52 and a vertical portion 51 connected with each other. The vertical portion 51 is electrically connected with the conductive wire 24 of the substrate 20. The vertical portion 51 can be contacted and connected with the substrate 20. Each leading component 50 includes a first contact surface 52a and a second contact surface 52b. The first contact surface 52a and the second contact surface 52b are non-coplanar. The at least one molding component 40 is disposed on the substrate 20 and covers at least part of the substrate 20 and at least part of the leading component 50, and the first contact surface 52a and the second contact surface 52b of the leading component 50 are uncovered by the molding component 40. The first contact surface 52a and the second contact surface 52b may be used in an electrical connection with an external module or an external circuit. The power module 1 includes a first surface 11 and a first lateral side 13. The first contact surface 52a of the leading component 50 is located at the first surface 11 of the power module 1 and the second contact surface 52b is located at the first lateral side 13 of the power module 1. In an embodiment, the power module 1 can be for example in shape of cuboid, and the first surface 11 and the first lateral side 13 of the power module 1 can form an angle of about 90 degrees. In one embodiment, the leading components 50 may be located at two lateral edges of the first side 21 and two lateral edges of the second side 22 of the substrate 20, respectively. The leading components 50 are electrically connected to the substrate 20 through a bonding material, such as a solder, a conductive silver paste or a sintered silver and etc. In the embodiment, there are four leading components 50 disposed on the first side 21 and the second side 22 of the substrate 20, respectively, but the present disclosure is not limited thereto. Each leading component 50 includes a first horizontal portion 52 and the vertical portion 51. The first horizontal portion 52 includes at least one first contact surface 52a and at least one second contact surface 52b. Namely, the first contact surface 52a and the second contact surface 52b are both located at the first horizontal portion 52. In addition, the conductive wire 24 can be disposed on the first side 21 and/or the second side 22 of the substrate 20. The vertical portion 51 of the leading component 50 has an end connected to the first horizontal portion 52 and another end connected with the conductive wire 24. For example, the first horizontal portion 52 of the leading component 50 is electrically connected with the power device 30 through the vertical portion 51 and the conductive wire 24 of the substrate 20.

In the embodiment, the conductive wire 24 includes at least one first wiring layer 24a and at least one second wiring layer 24b. The first wiring layer 24a can be disposed on the first side 21 or the second side 22 of the substrate 20. The second wiring layer 24b is disposed on an interlayer between the first side 21 and the second side 22 of the substrate 20. The first wiring layer 24a and the second wiring layer 24b can be electrically connected with each other, but the present disclosure is not limited thereto. In another embodiment, the vertical portion 51 of the leading component 50 can be electrically connected with the power device 30 through the first wiring layer 24a and/or the second wiring layer 24b, but the present disclosure is not limited thereto. Moreover, the molding component 40 covers the first side 21 and/or the second side 22 of the substrate 20, the power devices 30 and the leading components 50 to form the first surface 11, the second surface 12 and the first lateral side 13 of the power module 1. In the embodiment, the molding component 40 covers the vertical portion 51 of the leading component 50 and a part of the first horizontal portion 52 to expose the first contact surface 52a and the second contact surface 52b and provide a mechanical support with stable strength for the leading component 50, but the present disclosure is not limited thereto. It is noted that, in the embodiment, the first contact surface 52a and the second contact surface 52b of the leading component 50 are both located at the first horizontal portion 52 and uncovered by the molding component 40. For example, the first contact surface 52a of the first horizontal portion 52 is exposed on the first surface 11 of the power module 1, the second contact surface 52b of the first horizontal portion 52 is exposed on the first lateral side 13 of the power module 1, and the molding component 40 covers at least part of the vertical portion 51 of the leading component 50, and the leading component 50 is located through the molding component 40 to provide the first contact surface 52a and the second surface 52b. It benefits to achieve an electrical connection with for example a system board (not shown) or another module (not shown).

In the embodiment, the power module 1 further includes a magnetic component 60 disposed on the substrate 20 and is located through the substrate 20. The magnetic component 60 includes a first side 61 and a second side opposite to each other, and sidewalls 63. The molding component 40 can cover the sidewalls 63 of the magnetic component 60 and uncover the first side 61 and the second side 62 of the magnetic component 60. Certainly, in another embodiment, the molding component 40 can cover the first side 61 and the second side 62 of the magnetic component 60, but the present disclosure is not limited thereto. Moreover, in the embodiment, with the molding component 40 covering the power devices 30, the substrate 20, the magnetic component 60 and the leading components 50, the power module 1 can be integrated into a structure with flat surfaces. Meanwhile, the top surface of the molding component 40, the first side 61 of the magnetic component 60 and the first contact surfaces 52a of the leading components 50 disposed on the first side 21 of the substrate 20 are coplanar, for example forming the first surface 11 of the power module 1. The bottom surface of the molding component 40, the second side 62 of the magnetic component 60 and the first contact surfaces 52a of the leading components 50 disposed on the second side 22 of the substrate 20 are coplanar, for example forming the second surface 12 of the power module 1. Moreover, the lateral surface of the molding component 40 and the second contact surfaces 52b of the leading components 50 are coplanar, for example forming the lateral side 13 of the power module 1. Certainly, the present disclosure is not limited thereto. For example, in other embodiments, the magnetic component 60 can be omitted. Alternatively, the power module 1 includes one, two or three of the four leading components 50 in FIG. 1, or further includes an additional leading component. The present disclosure is not limited thereto.

Figure 2A:
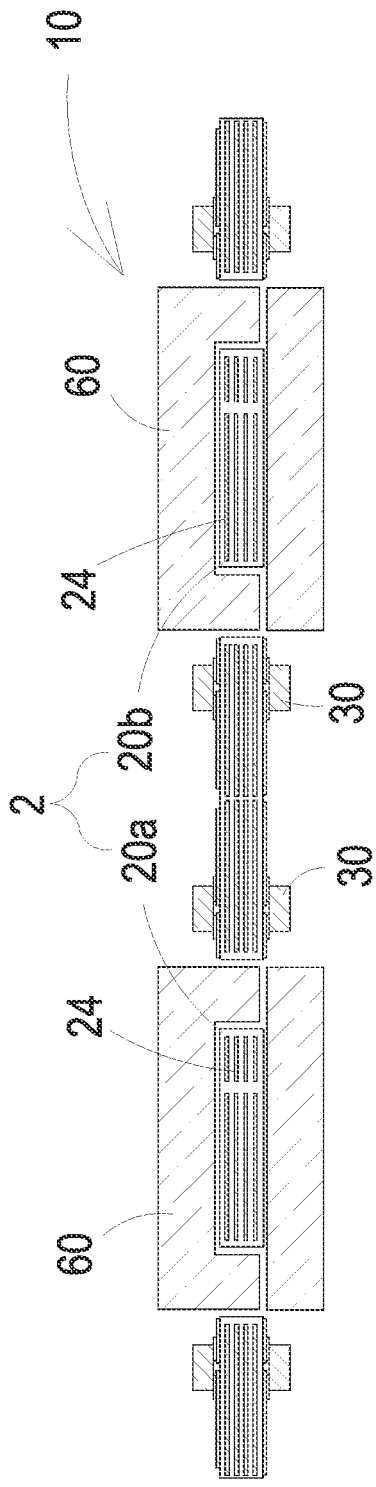
Figure 2B:
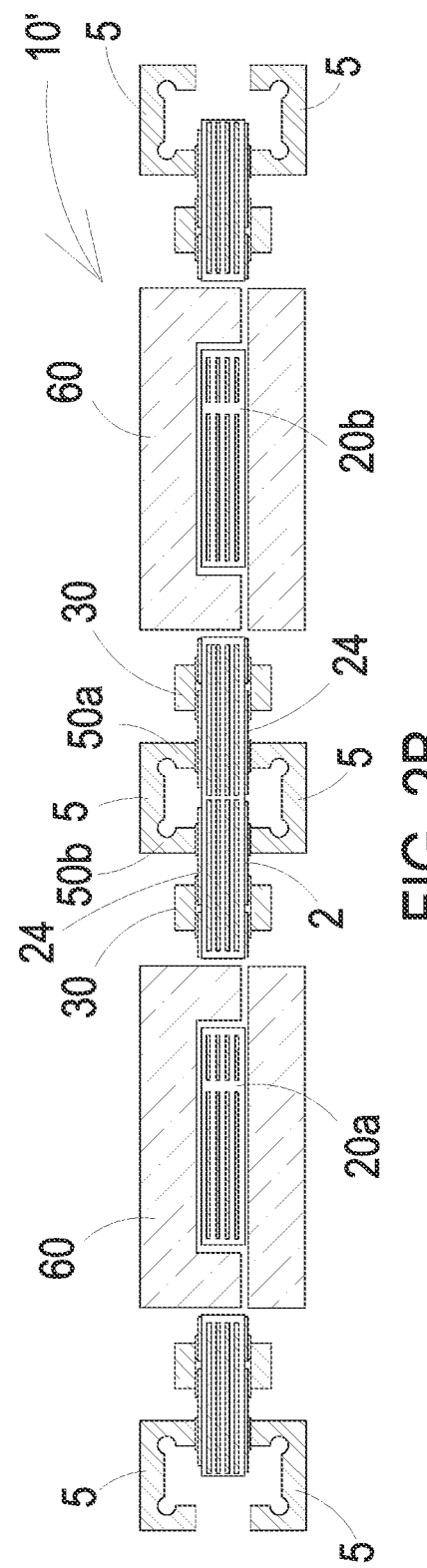

On the other hand, the above power module 1 can be manufactured by means of molding a panel structure. Please refer to FIGS. 1 and 2A to 2D. FIGS. 2A to 2D are schematic cross-sectional views illustrating a manufacturing process for producing two power modules of the first embodiment of the present disclosure. It should be noted that, in this embodiment, although the manufacturing process of the panel structure is described by taking two power modules as an example, the present disclosure is not limited thereto. In other embodiments, the power modules 1 may be arranged on the substrate panel in m rows and n columns (m≥2, n≥1). The power modules 1 may be arranged in other arrangements, such as an arrangement with the leading unit shown in FIG. 3A. The present disclosure is not limited thereto. In the embodiment, firstly, as shown in FIG. 2A, a substrate panel 2 is provided and includes a plurality of substrates, wherein each substrate is similar to the substrate 20 of FIG. 1 and connected with each other (for example it is presented as an entire substrate) before being separated. The plurality of substrates are arranged in an array. In the embodiment, each substrate includes a first side 21 and a second side 22 opposite to each other (refer to FIG. 1), and further includes a conductive wire 24. In the embodiment, the plurality of substrate can be exemplified by at least two substrates (a first substrate 20a and a second substrate 20b) adjacent to each other, but the present disclosure is not limited thereto. The first substrate 20a and the second substrate 20b may be similar to the substrate 20 described in the above embodiment. For example, the power devices 30 and at least one conductive wire 24 are pre-disposed on the first sides 21 and the second sides 22 (refer to FIG. 1) of the first substrate 20a and the second substrate 20b, and form a panel structure 10. In an embodiment, in addition to the power devices 30 and the conductive wire 24, one or a plurality of magnetic components 60 are provided and disposed on the substrate panel 2. In the embodiment, the plurality of magnetic components 60 are disposed on the first substrate 20a and the second substrate 20b of the plurality of substrates. Each magnetic component 60 are located through the corresponding substrate. However, the present disclosure is not limited thereto. Then, as shown in FIG. 2B, at least one leading unit 5 is provided and disposed on the substrate panel 2. The leading unit 5 can be cut and separated into two leading components 50. It should be noted that the vertical portion 51 of the leading unit 5 on the leftmost side of FIG. 2B is suspended, but may be connected to the substrate panel 2, which is omitted and not presented in the drawing. Similarly, the vertical portion 51 of the leading unit 5 on the rightmost side of FIG. 2B can be connected to the substrate panel 2, which is omitted and not presented in the drawing. In the embodiment, at least one leading unit 5 includes at least two of the first leading component 50a and the second leading component 50b, which are connected and adjacent to each other. The first leading component 50a and the second leading component 50b both include a first horizontal portion 52 and a vertical portion 51, respectively (refer to FIG.

Figure 2E:
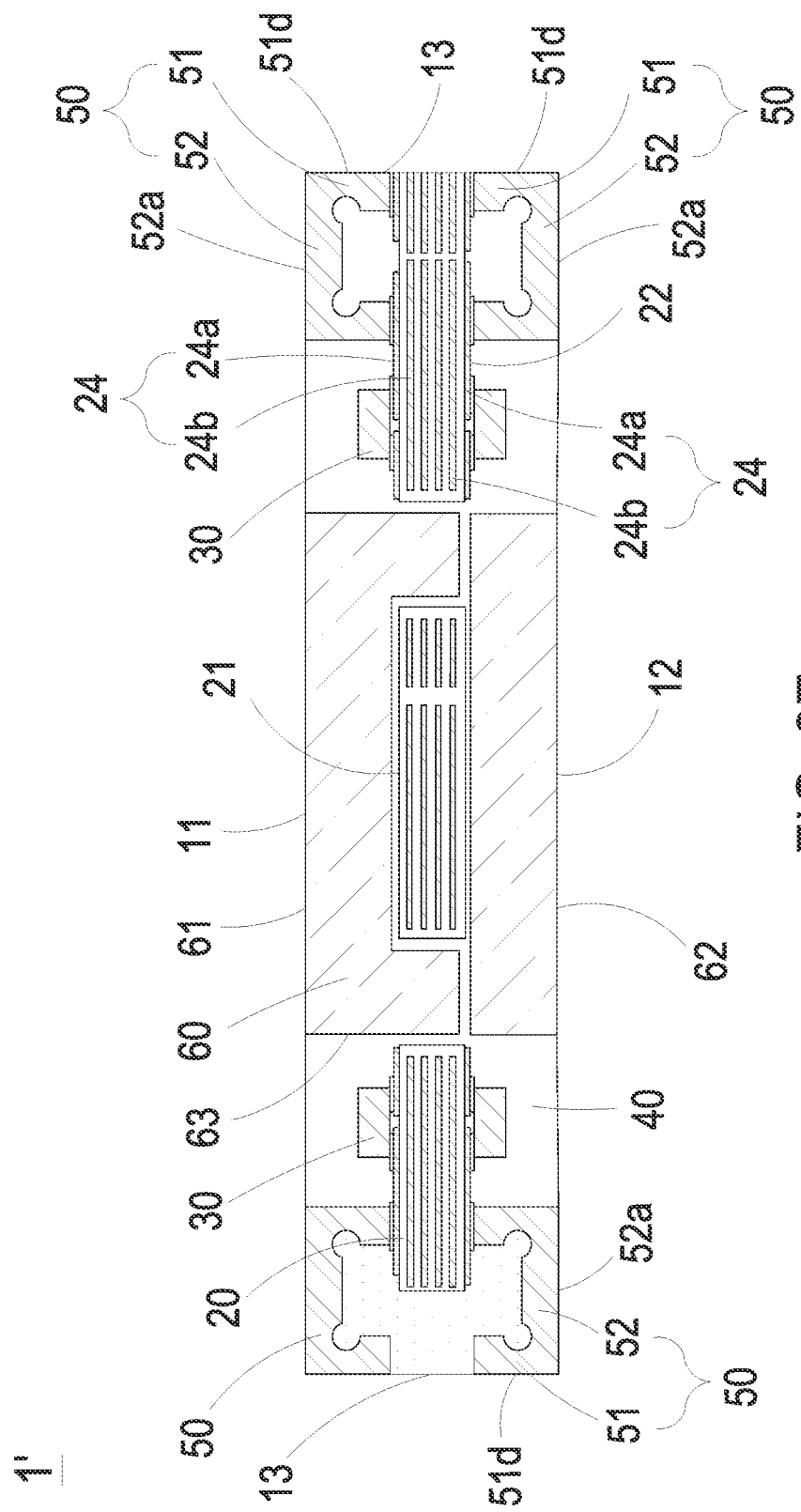
FIG. 2E is a schematic cross-sectional view illustrating another embodiment of the power module fabricated by the manufacturing process of FIGS. 2A to 2C.

2D). The first horizontal portions 52 of the first leading component 50a and the second leading component 50b are electrically connected to the conductive wires 24 of the first substrate 20a and the second substrate 20b through the corresponding vertical portions 51, respectively, and form the panel structure 10'. It is noted that the order of disposing the power device 30, the magnetic component 60 and the leading unit 5 on the substrate panel 2 is not limited thereto, and it is adjustable according to the practical requirements. It is not redundantly described herein. Afterward, as shown in FIG. 2C, a molding layer 40' is formed and disposed on the substrate panel 2 to partially cover at least the first leading component 50a and the second leading component 50b. In the embodiment, the molding layer 40' covers the power devices 30, the sidewalls 63 of the magnetic components 60 and a part of the leading unit 5 and uncover at least one horizontal surface 5' of the leading unit 5, thereby forming the panel structure 10". Finally, the panel structure 10" is cut by for example a mechanical cutting. The substrate panel 2, the leading unit 5 and the molding layer 40' are separated respectively. Consequently, the molding layer 40' is separated to form the plurality of molding components 40, and the first leading component 50a and the second leading component 50b of the leading unit 5 are separated. Thus, two power modules 1 are obtained. The two power modules 1 both have the same structure of the power module 1 shown in FIG. 1. It is noted that the leading unit 5 is cut to form the first leading component 50a and the second leading component 50b. The first leading component 50a and the second leading component 50b both include a vertical portion 51 and a first horizontal portion 52. The horizontal surface 5' of the leading unit 5 is cut to form the first contact surfaces 52a of the first horizontal portions 52, and the two cut surfaces are separated to form the second contact surfaces 52b. In the embodiment, the two leading components 50 are formed by cutting one single leading unit 5. In other embodiments, only one single leading component 50 can be formed by cutting one single leading unit 5. The portion of the leading unit 5 which is not used to form the leading component 50 can provide a stable support during the manufacturing process and be simultaneously removed when the leading unit 5 is cut to form the leading component 50. For example, the portions of the leading units 5 at the outmost edges of the panel structure 10" in the foregoing FIG. 2C is partially cut and removed to expose the cutting cross section in the step of FIG. 2D, but the present disclosure is not limited thereto. It should be emphasized that the leading unit 5 in the foregoing embodiment can also be selectively cut to form one single leading component 50. For example, the panel structure 10" shown in FIG. 2C can be selectively cut to form the power module 1' shown in FIG. 2E. The leading unit 5 of FIG. 2C is cut along the vertical portion 51 to form one single leading component 50. The power module 1' includes a first surface 11, a second surface 12 and a first lateral side 13. The first contact surface 52a is formed and located at the first horizontal portion 52, and the second contact surface 51d is formed and located at the vertical portion 51. For example, the first contact surface 52a of the leading component 50 is located at the first surface 11 of the power module 1', and the second contact surface 51d is located at the lateral side 13 of the power module 1'. Certainly, the present disclosure is not limited thereto.

Figure 3A:
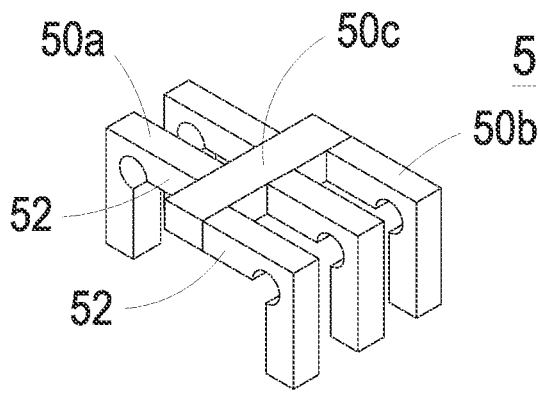
FIG. 3A is a perspective structural view illustrating a first exemplary structure of the leading unit of the present disclosure.
Figure 3B:
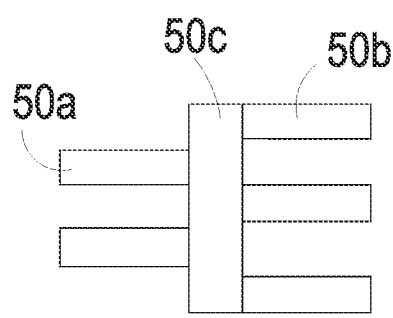
FIG. 3B is a top view of FIG. 3A.
Figure 3C:
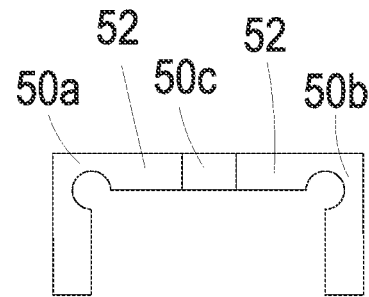
FIG. 3C is a front view of FIG. 3A.
Figure 3D:
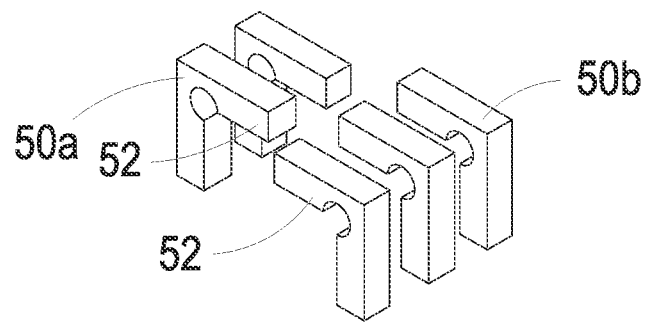
FIG. 3D is a perspective structural view illustrating the leading components produced by separating the leading unit of FIG. 3A.

Please refer to FIGS. 1, 2A to 2D and 3A to 3D. FIG. 3A is a perspective structural view illustrating a first exemplary structure of the leading unit of the present disclosure. FIG. 3B is a top view of FIG. 3A. FIG. 3C is a front view of FIG. 3A. FIG. 3D is a perspective structural view illustrating the leading components produced by separating the leading unit of FIG. 3A. In the manufacturing process with the panel structure, the leading unit 5 can include one first leading component 50a and one second leading component 50b. The first horizontal portion 52 of the first leading component 50a and the first horizontal portion 52 of the second leading component 50b are connected with each other through a joint portion 50c, so as to temporarily form one horizontal surface 5' of the leading unit 5 (refer to FIG. 2C) and achieve the fixing of the plurality of leading components 50 (refer to FIGS. 1 and 3A). When the panel structure 10" (refer to FIG. 2C) is cut, the joint portion 50c of the leading unit 5 can be removed by the mechanical cutting or the chemical etching process to separate the leading unit 5 to form the first leading component 50a and the second leading component 50b with at least two separated surfaces. The horizontal surface 5' of the leading unit 5 is separated to form a first contact surface 52a of the first leading component 50a and a first contact surface 52a of the second leading component 50b. The at least two separated surfaces are configured to form a second contact surface 52b of the first leading component 50a and a second contact surface 52b of the second leading component 50b (refer to FIG. 2D). Moreover, in the embodiment, the cutting process can be performed by a cutting tool having a width larger than the width of the joint portion 50c, so as to simultaneously remove the joint portion 50c while cutting the panel structure 10". In other embodiments, the joint portion 50c can be removed by two or more cuttings. For example, a junction part between the first leading component 50a and the joint portion 50c, and a junction part between the second leading component 50b and the joint portion 50c are cut, respectively, so as to remove the joint portion 50c and obtain two independent power modules 1 having the leading components 50 as shown in FIG. 2D.

Figure 4A:
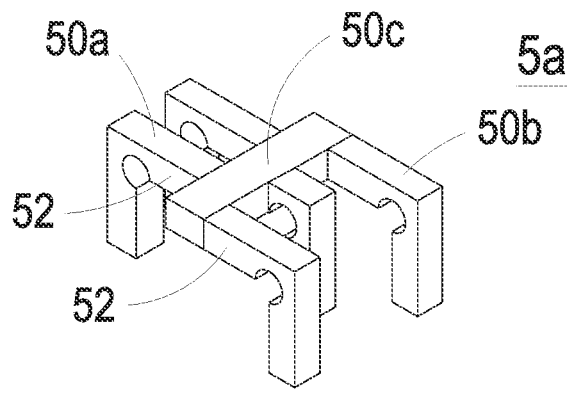
FIG. 4A is a perspective structural view illustrating a second exemplary structure of the leading unit of the present disclosure.
Figure 4B:
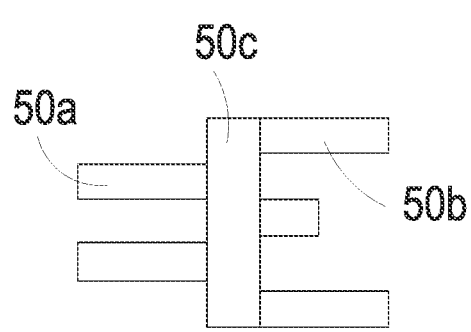
FIG. 4B is a top view of FIG. 4A.
Figure 4C:
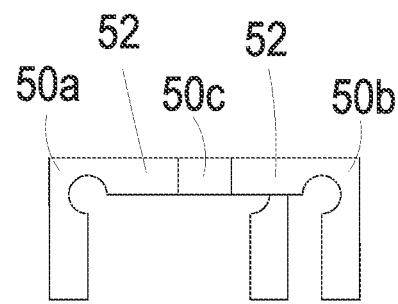
FIG. 4C is a front view of FIG. 4A.
Figure 4D:
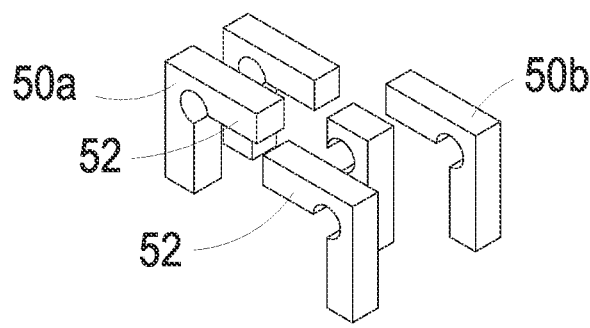
FIG. 4D is a perspective structural view illustrating the leading components produced by separating the leading unit of FIG. 4A.

FIG. 4A is a perspective structural view illustrating a second exemplary structure of the leading unit of the present disclosure. FIG. 4B is a top view of FIG. 4A. FIG. 4C is a front view of FIG. 4A. FIG. 4D is a perspective structural view illustrating the leading components produced by separating the leading unit of FIG. 4A. In the embodiment, the leading unit 5a can include one first leading component 50a and one second leading component 50b. The first leading component 50a and the second leading component 50b are connected to each other through a joint portion 50c. The second leading component 50b may have different lengths adjusted according to the practical requirements, thereby achieving different configurations of the substrate panel 2. However, the present disclosure is not limited thereto, and not redundantly described herein. The cutting method can also be performed in several times. For example, the two lateral sides of the joint portion are cut respectively, so as to obtain a plurality of independent power modules. The residual part including the joint portion is discarded as waste. In addition, it is noted that when the molding layer 40 is formed, the surface of the lead component 50 or the surface of the magnetic component 60 may be partially covered by the residual glue due to the tolerance of the molding process. Meanwhile, the surface can be further treated in a manner, for example grinding, sandblasting or chemical treating, to expose the surface, such as the horizontal surface 5' of the leading unit 5 (refer to FIG. 2C), which is desired to be exposed. In one embodiment, the horizontal surface 5' of the leading unit 5 can be surface-treated by, for example an electroless plating or an electroplating, to obtain a good solderable surface, but the present disclosure is not limited thereto.

In the above embodiments, an advantage of using the joint portion 50c to integrally form the plurality of first leading components 50a and the plurality of second leading components 50b to form the leading units 5, 5a is that the footprint of the integrated form comparing with directly using the plurality of independent leading components 50 (refer to FIG. 1) can be reduced effectively. Since the independent leading components 50 have to be assembled on the first surface 21 or the second surface 22 of the substrate 20 for maintaining the stability of the manufacturing process, the size reduction of the power module 1 is limited. In the embodiment, the joint portion 50c is used to pre-connect the plurality of first leading components 50a and the plurality of second leading components 50b into an integrated structure of the leading unit 5, 5a. The structure of the overall leading unit 5, 5a is stable relatively. Thereafter, the plurality of first leading components 50a and the plurality of second leading components 50b are formed by cutting, and it benefits to reduce the footprint of the forgoing leading components 50 greatly. In the embodiment, the structure of the leading unit 5, 5a can be formed by for example metal-sheet patterning (stamping) and bending. In another embodiment, the leading unit 5, 5a can be formed by a leading frame fabrication process, such as the arts of metal-sheet etching and then bending. By utilizing the leading unit 5, 5a, the distance between the first leading components 50a and the second leading components 50b can be controlled accurately, and it benefits to avoid the offset issue caused by the independent leading components 50 (shown in FIG. 1). Thus, the footprint of the power module 1 can be further reduced. In the embodiment, the thickness of the leading unit 5, 5a is usually ranged from 0.15 mm to 1 mm, which generally meets the requirement of current-carrying capacity of the power module 1 and the limitation of the manufacturing capability at the same time.

In another embodiment, the power module 1 can be produced in the form of a single module per molding cavity, wherein the leading component 50 for the electrode can be produced from a leading unit 5 as shown in FIGS. 3A to 3D. While in the cutting operation, only a portion of the leading unit 5 on one side of the joint portion 50c is remained to work. For example, the first leading component 50a is taken as an effective portion. The other side, for example, the second leading member 50b is used to provide the functions of temporary structural supporting, and would be removed after the molding process and the cutting operation. However, the present disclosure is not limited thereto.

Figure 5:
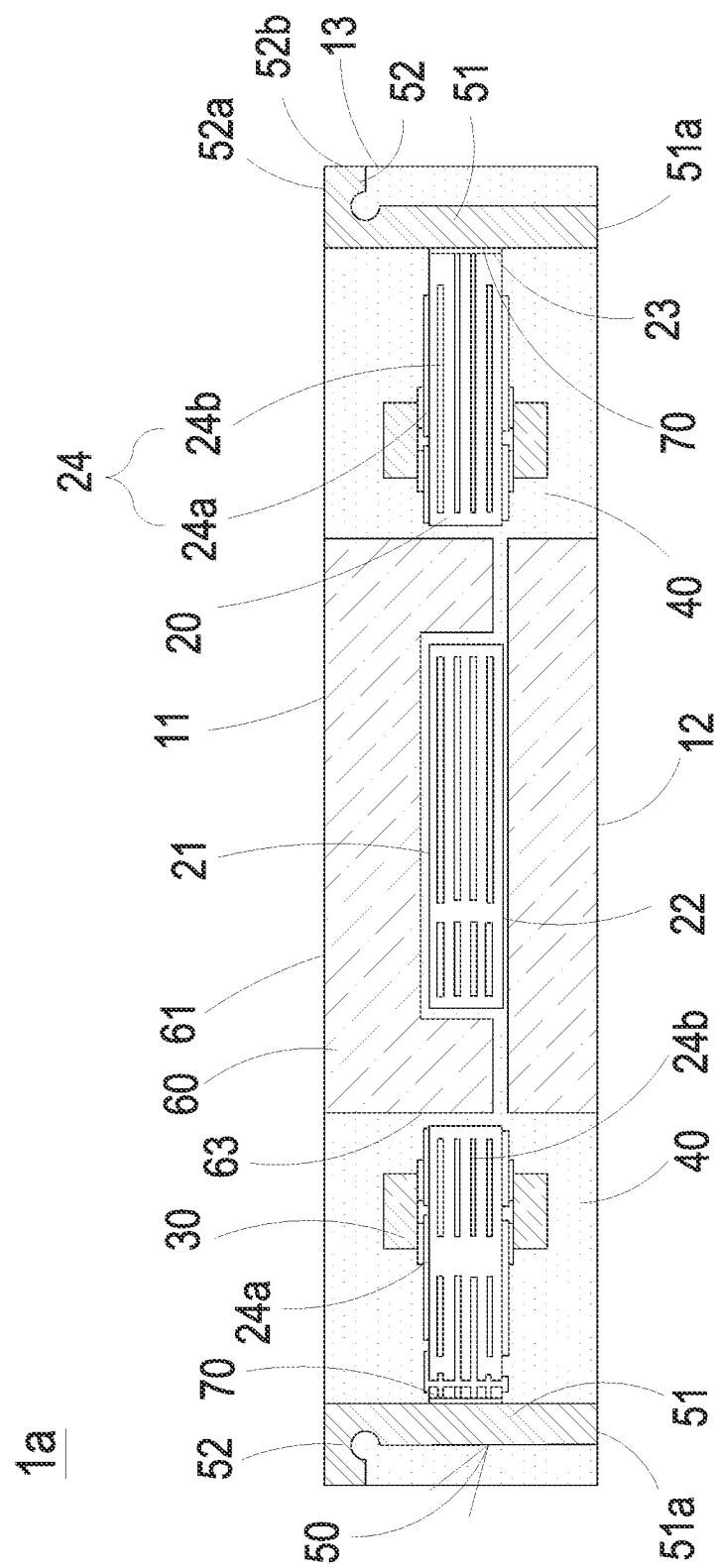
FIG. 5 is a schematic cross-sectional view illustrating a power module according a second embodiment of the present disclosure.

FIG. 5 is a schematic cross-sectional view illustrating a power module according a second embodiment of the present disclosure. In the embodiment, the structures, elements and functions of the power module 1a are similar to those of the power module 1 of FIG. 1, and are not redundantly described herein. Different from the power module 1 of FIG. 1, the substrate 20 of the present embodiment further includes a connection portion 70 disposed on the lateral wall 23 of the substrate 20. The connection portion 70 is electrically connected to the conductive wire 24. The vertical portion 51 of the leading component 50 is further connected with the connection portion 70 disposed on the lateral wall 23 of the substrate 20. The connection portion 70 is formed by for example copper coating on the lateral wall 23 of the substrate 20 and the connection portion 70 may be electrically connected with part of or all of wiring layers of the conductive wire 24, and the connection portion 70 made this way can have a larger connection area than the side surface of the conductive wire 24 does. Another way to form the connection portion 70 is to directly use the lateral sides of the wiring layer of the conductive wire 24. Preferably but not exclusively, the power module 1a includes at least one leading components 50, comprising two leading components 50, connected to the substrate 20 through the connection portions 70, respectively. Similarly, each leading component 50 can include a vertical portion 51 and a first horizontal portion 52. In the embodiment, one side of the vertical portion 51 of the leading component 50 is further electrically connected with the conductive wire 24 of the substrate 20 through the connection portion 70. In such way, the conductive wire 24 on the substrate 20 can achieve the electrical/thermal connection to the leading component 50 at the closest distance, thereby further improving the electrical/thermal performance of the power module 1a. The power module 1a includes the first contact surface 52a of the first horizontal portion 52a located at the first surface 11, the third contact surface 51a of the vertical portion 51 located at the second surface 12, and the second contact surface 52b of the horizontal portion 52 located at the first lateral side 13. The first surface 11 and the second surface 12 of the power module 1a are opposite to each other. In the embodiment, the conductive wire 24 can include a first wiring layer 24a disposed on the first side 21 of the substrate 20 and a second wiring layer 24b disposed between the first side 21 and the second side 22 of the substrate 20. The present disclosure is not limited thereto. It is noted that since the thickness of the leading component 50 is generally greater than the thickness of the first wiring layer 24a or the second wiring layer 24b of the substrate 20, which is exposed on the lateral wall 23 of the substrate 20, the leading component 50 can further enhance the conductive capability and the heat-dissipation capability of the conductive wire 24. Thus, the overall electrical/thermal impedance of the power module 1a can be effectively reduced, and the performance of the power module 1a can be improved.

Figure 6C:
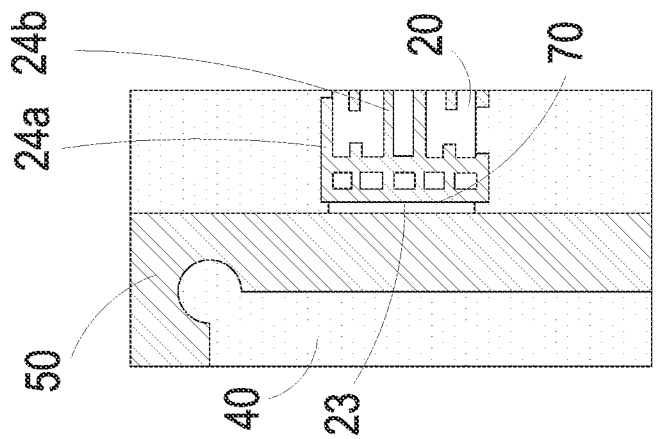
FIG. 6C is a third exemplary structure illustrating the connection portion connected between the leading component and the substrate of the present disclosure.
Figure 6B:
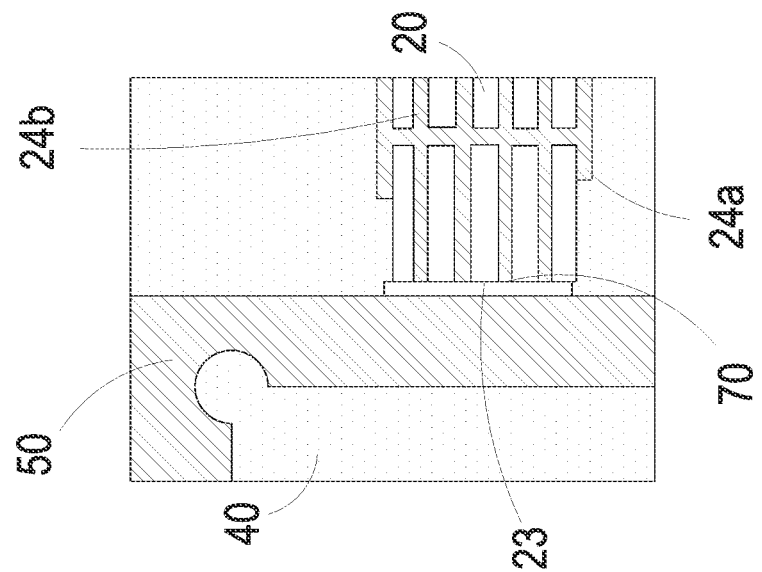
FIG. 6B is a second exemplary structure illustrating the connection portion connected between the leading component and the substrate of the present disclosure.
Figure 6A:
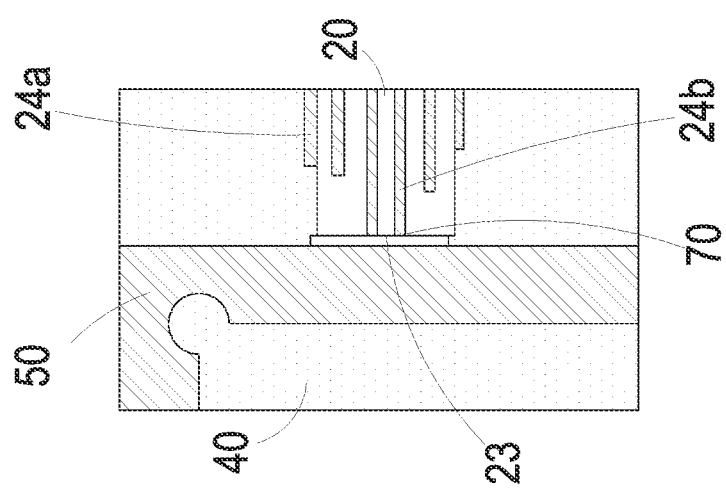
FIG. 6A is a first exemplary structure illustrating the connection portion connected between the leading component and the substrate of the present disclosure.

In the embodiment, the leading component 50 can be connected to the connection portion 70 formed on the lateral wall 23 of the substrate 20 by for example a solder, a conductive silver paste or a sintered silver. FIG. 6A is a first exemplary structure illustrating the connection portion connected between the leading component and the substrate of the present disclosure. FIG. 6B is a second exemplary structure illustrating the connection portion connected between the leading component and the substrate of the present disclosure. FIG. 6C is a third exemplary structure illustrating the connection portion connected between the leading component and the substrate of the present disclosure. As shown in the FIG. 6A and FIG. 6B, in the embodiment, each of the second wiring layers 24b in the substrate 20 is exposed on the lateral wall 23 of the substrate 20 as the connection portion 70. As shown in the FIG. 6C, the connection portion 70 is formed by copper coating on the lateral wall 23 of the substrate 20 connecting the second wiring layers 24b to increase the connection area of the lateral side, which can be connected with the leading component 50 by a bonding material, for example a solder, a conductive silver paste or a sintered silver. Consequently, the electrical connection of the leading component 50 and the conductive wire 24 is achieved. In an embodiment, as shown in FIGS. 6A and 6B, each of the second wiring layers 24b of the substrate 20 is exposed by cutting the substrate 20. Thereafter, the electrical connection of the leading component 50 and the conductive wire 24 can be achieved by a bonding material, for example a solder, a conductive silver paste or a sintered silver. Moreover, as shown in FIG. 6B, each of the second wiring layers 24b and the first wiring layer 24a of the substrate 20 can be further connected through a conductive via. The conductive via can be utilized to connect any two of the second wiring layers 24b or more second wiring layers 24b, or connect the second wiring layer 24b and the first wiring layer 24a, but the present disclosure is not limited thereto. Preferably but not exclusively, the conductive via can be constructed in form of a through hole, a blind hole, a buried hole or a stacked hole. As shown in FIG. 6C, the conductive via is formed in the substrate 20 to connect the plurality of second wiring layers 24b and the first wiring layer 24a, and the connection portion 70 is further formed on the lateral wall 23 of the substrate 20 by cutting the conductive via or metalizing. It benefits to be electrically connected to the leading component 50 and achieve the electrical connection between the plurality of second wiring layer 24a and the first wiring layer 24a at the same time. Thus, the current-carrying capability of the power module 1 can be enhanced. Certainly, the present disclosure is not limited thereto. As to the manufacturing process of the connection portion 70, it is further described as follows.

Figure 8B:
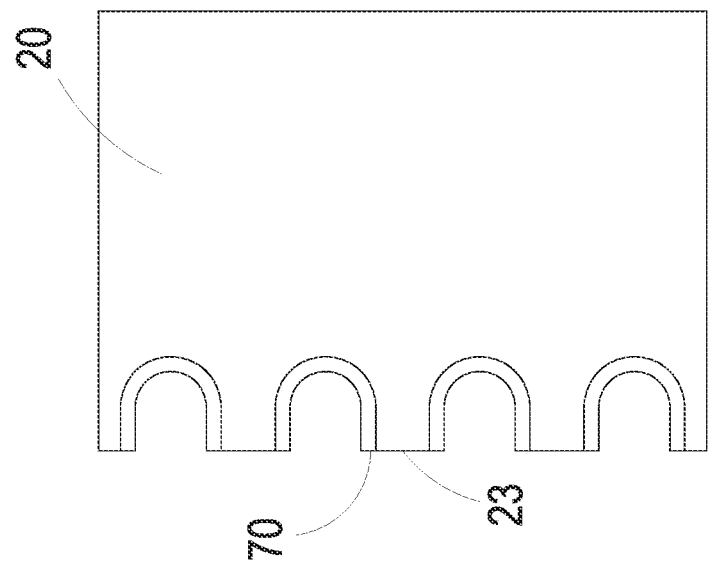
FIGS. 8A and 8B show a second exemplary art to produce the connection portion of the present disclosure.
Figure 8A:
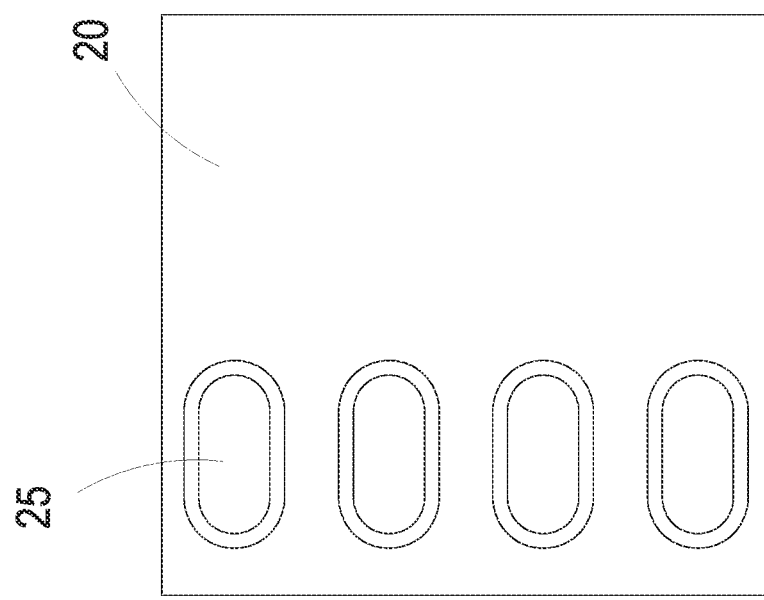
Figure 9B:
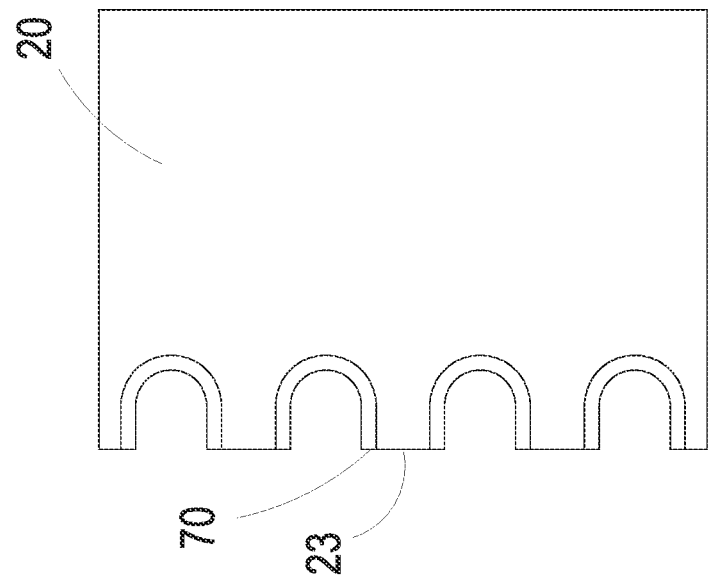
FIGS. 9A and 9B show a third exemplary art to produce the connection portion of the present disclosure.
Figure 9A:
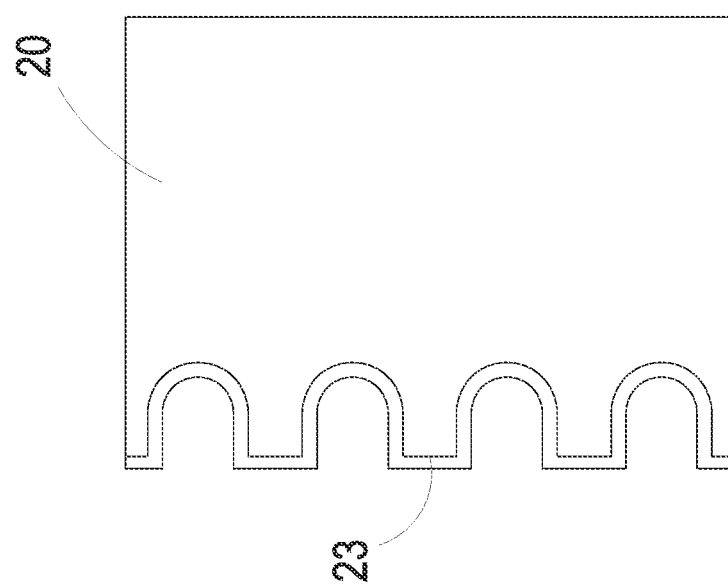

Please refer to FIGS. 7A to 7B, 8A to 8B and 9A to 9B. FIGS. 7A and 7B show a first exemplary art to produce the connection portion of the present disclosure. Firstly, as shown in FIG. 7A, the entire lateral wall 23 of the substrate 20 is metalized to form a metallization layer. Then, as shown in FIG. 7B, the structure of the desired connection portion 70 can be constructed on the lateral wall 23 of the substrate 20 by for example mechanical drilling or milling to remove the location where no connection is required. Thus, the electrical connection between the leading component 50 and the connection portion 70 can be achieved through a bonding material, for example a solder, a conductive silver paste or a sintered silver. FIGS. 8A and 8B show a second exemplary art to produce the connection portion of the present disclosure. In the embodiment, as shown in FIG. 8A, a plurality of hollow structures 25, such as through holes, are formed at the edge of the substrate 20, and a metallization layer is formed on the sidewalls of the hollow structures 25. Then, as shown in FIG. 8B, the location where no connection is required can be removed by cutting, and the structure of the desired connection portion 70 can be constructed on the lateral wall 23 of the substrate 20. FIGS. 9A and 9B show a third exemplary art to produce the connection portion of the present disclosure. In the embodiment, as shown in FIG. 9A, the lateral wall 23 having a plurality of concave-and-convex structures is formed at the edge of the substrate 20, and a metallization layer is formed on the entire lateral wall 23. Then, as shown in FIG. 9B, the location where no connection is required can be removed by cutting, and the structure of the desired connection portion 70 can be constructed on the lateral wall 23 of the substrate 20. It should be emphasized that the arrangement of the connecting portion 70 in the power module 1 of the present disclosure is adjustable according to the practical requirements. The present disclosure is not limited thereto.

Figure 10C:
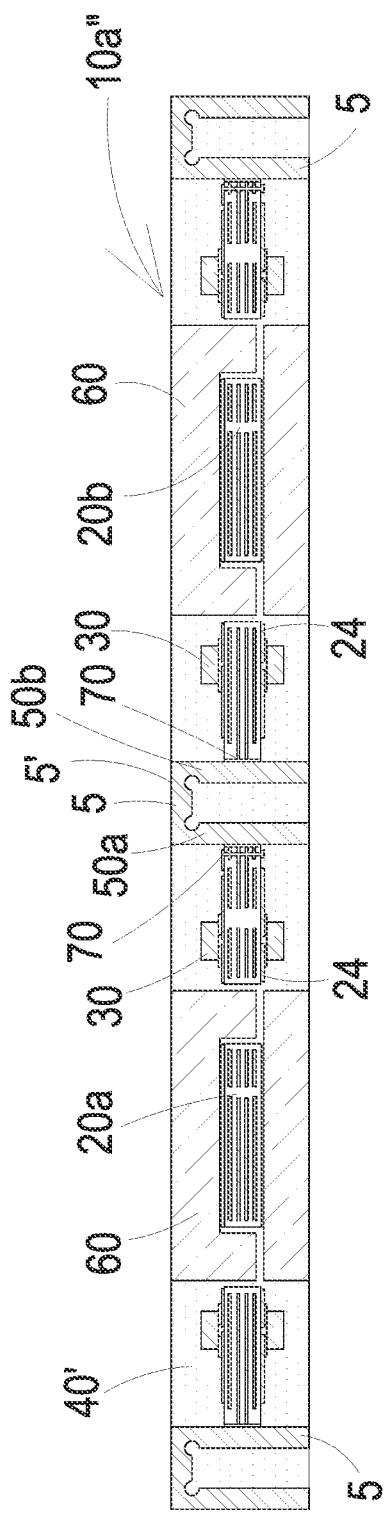
Figure 10D:
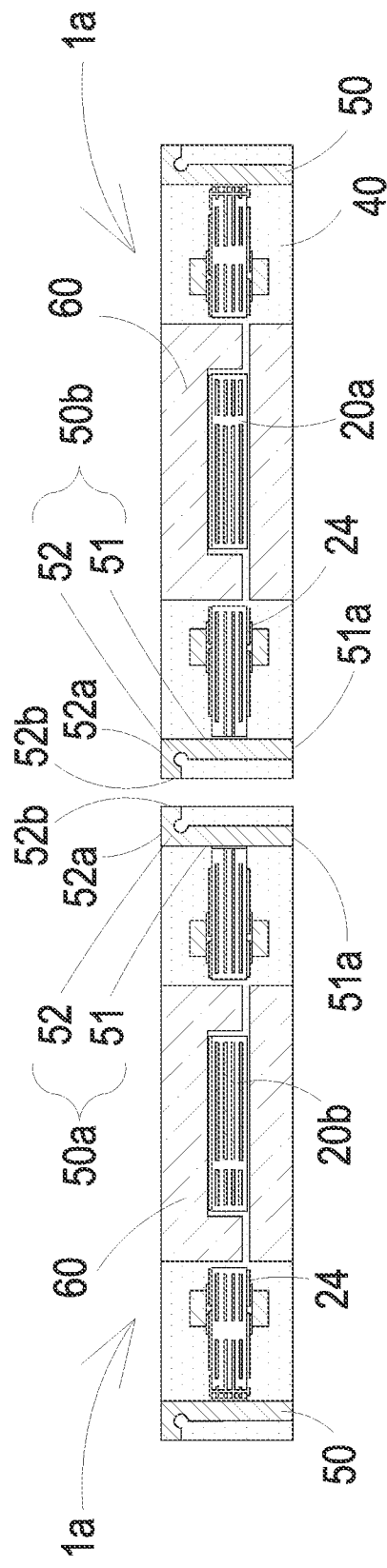

FIGS. 10A to 10D are schematic cross-sectional views illustrating a manufacturing process for producing two power modules of the second embodiment of the present disclosure. It should be noted that, in this embodiment, although the manufacturing process of the substrate panel is described by taking two power modules as an example, the present disclosure is not limited thereto. In other embodiments, the power modules 1a may be arranged on the substrate panel in m rows and n columns (m≥2, n≥1). In the embodiment, firstly, as shown in FIG. 10A, a substrate panel 2a is provided and includes a plurality of substrates arranged in an array. In the embodiment, the substrate panel 2a can be exemplified by an assembly of at least a first substrate 20a and a second substrate 20b adjacent to each other and having the same size after cutting. The first substrate 20a and the second substrate 20b are similar to the substrate 20 described in the above embodiment. For example, the power devices 30, the magnetic components 60 and at least one conductive wire 24 are pre-disposed on the first sides 21 and the second sides 22 (refer to FIG. 5) of the first substrate 20a and the second substrate 20b, so as to form a panel structure 10a. In the embodiment, the substrate panel 2a further includes a hollow portion 20c disposed between the adjacent first substrate 20a and second substrate 20b. Usually, the hollow portion 20c is free of disconnecting the first substrate 20a and the second substrate 20b. FIGS. 10A and 10B are for illustrative purposes merely. For example, two opposite lateral walls 23 between the first substrate 20a and the second substrate 20b are configured to form the hollow portion 20c. Preferably but not exclusively, the hollow portion 20c can be in form of holes and slots. Moreover, the adjacent two of the first substrate 20a and the second substrate 20b both include the connection portions 70 disposed on the two opposite lateral walls 23 of the first substrate 20a and the second substrate 20b, so as to define two opposite lateral walls of the hollow portion 20c. Then, as shown in FIG. 10B, at least one leading unit 5 is provided. The leading unit 5 can be cut and separated into at least one first leading component 50a and at least one second leading component 50b. The leading unit 5 is inserted into an accommodation slot of the hollow portion 20c, and connected to the conductive wire 24 of the first substrate 20a and the conductive wire 24 of the second substrate 20b through the connection portions 70, so as to form the panel structure 10a'. In an embodiment, the first leading component 50a and the second leading component 50b of the at least one leading unit 5 are inclined outwardly at an angle A, respectively, as shown in FIGS. 12A to 12C. In that, when the at least one leading unit 5 is disposed on the substrate panel 2, the at least one leading unit 5 is inserted into the hollow portion 20c to provide an elastic force against the lateral walls 23. Thus, the vertical portions 51 of the first leading component 50a and the second leading component 50b of the leading unit 5 abut against the corresponding connection portions 70 of the first substrate 20a and the second substrate 20b, respectively. It is noted that the order of disposing the power device 30, the magnetic component 60 and the leading unit 5 on the substrate panel 2a is not limited thereto, and it is adjustable according to the practical requirements. It is not redundantly described herein. Afterward, as shown in FIG. 10C, the molding layer 40 are formed to cover the power devices 30, the magnetic components 60 and the leading unit 5 and uncover at least one horizontal surface 5' of the leading unit 5, thereby forming the panel structure 10a''. Finally, the panel structure 10a'' is cut by for example a mechanical cutting to separate the substrate panel 2a, the leading unit 5 and the molding layer 40 and obtain two power modules 1a. The two power modules 1a both have the same structure, which is similar to the power module 1a shown in FIG. 5. It is noted that the leading unit 5 is cut to form the first leading component 50a and the second leading component 50b. The first leading component 50a and the second leading component 50b both include a vertical portion 51 and a first horizontal portion 52. The horizontal surface 5' of the leading unit 5 is cut to form the first contact surfaces 52a of the first horizontal portions 52, and the two cut surfaces are separated to form the second contact surfaces 52b. In other embodiments, the single leading component 50 can be formed by cutting one single leading unit 5. The portion of the leading unit 5 which is not used to form the leading component 50 can provide a stable support during the manufacturing process and be simultaneously removed when the leading unit 5 is cut to form the leading component 50. For example, the portions of the leading units 5 at the outmost edges of the foregoing panel structure 10a'' are removed, but the present disclosure is not limited thereto.

Figure 11:
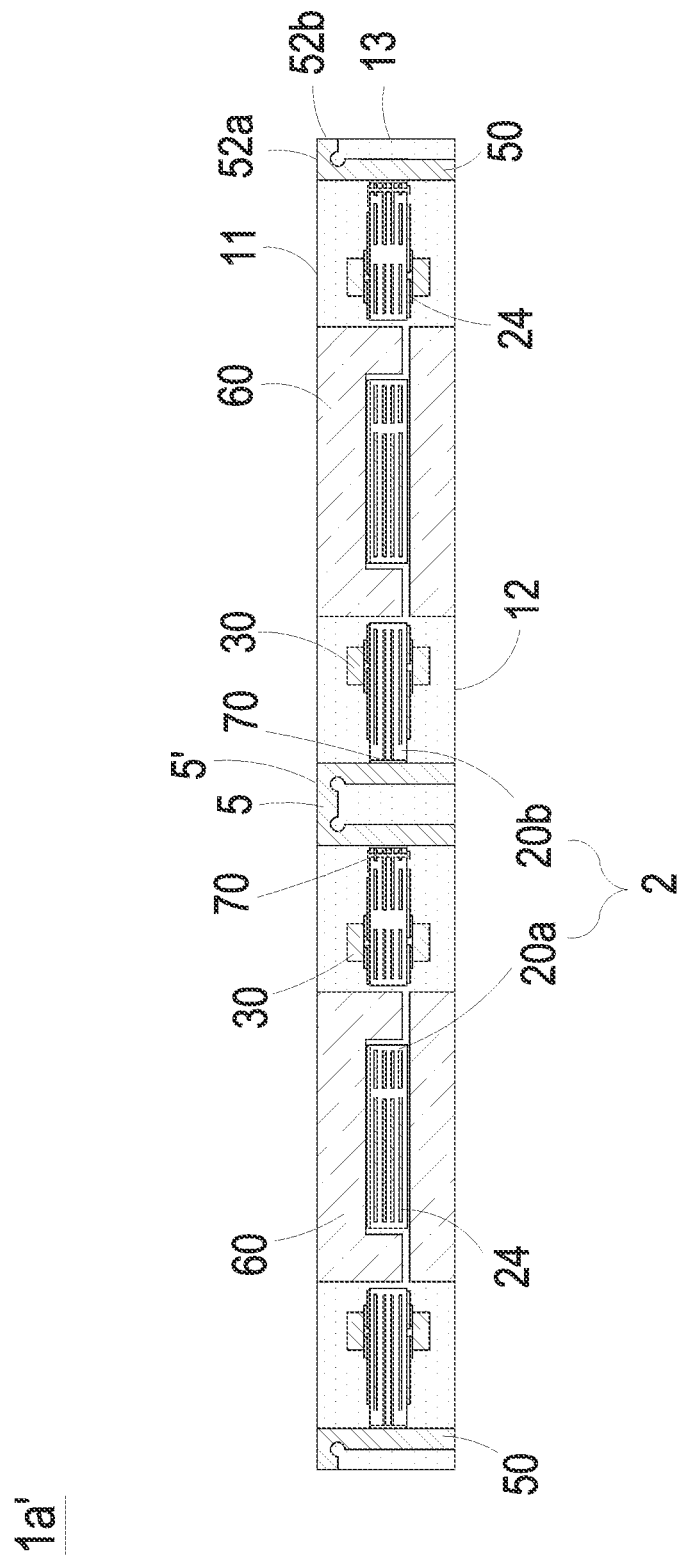
FIG. 11 is a schematic cross-sectional view illustrating a power module according a third embodiment of the present disclosure.

FIG. 11 is a schematic cross-sectional view illustrating a power module according a third embodiment of the present disclosure. In the embodiment, the structures, elements and functions of the power module 1a' are similar to those of the power module 1a of FIG. 5, and are not redundantly described herein. In the embodiment, the power module 1a' can be manufactured by a manufacturing process similar to that of FIGS. 10A to 10C. In this embodiment, except that the lead component 50 is disposed nearby the first lateral side 13, the power module 1a' further includes an uncut leading unit 5 and the surface 5' of the leading unit 5 is configured to provide an additional contact surface. For example, the panel structure 10a'' can be selectively cut according to the practical requirements, to form two power devices 1a including the first contact surface 52a, the second contact surface 52b and the third contact surface 51a, as shown in FIG. 5, or alternatively form one single power module 1a', as shown in FIG. 11, which has two power modules 1a of FIG. 10 integratedly formed therein. Certainly, the present disclosure is not limited thereto.

On the other hand, it is noted that, in the embodiment, the hollow portion 20c disposed between the first substrate 20a and the second substrate 20b is used for the leading unit 5 inserting therein. Thus, the first leading component 50a and the second leading component 50b are electrically connected with the connection portion 70 on the lateral wall 23 of the first substrate 20a and the connection portion 70 on the lateral wall 23 of the second substrate 20b, respectively. In order to facilitate the production, the leading unit 5 may be prefabricated, and a bonding material such as a solder, a conductive silver paste or a sintered silver may be pre-disposed on the leading unit 5.

FIG. 12A is a lateral view illustrating a third exemplary structure of the leading unit of the present disclosure. FIG. 12B is a lateral view illustrating a fourth exemplary structure of the leading unit of the present disclosure. FIG. 12C is a lateral view illustrating a fifth exemplary structure of the leading unit of the present disclosure. Please refer to FIGS. 10A to 10D and 12A. As shown in the drawings, the bonding material, such as the solder, the conductive sliver paste or the sintered silver, can be pre-disposed on positions of the leading unit 5b, which are connection positions of the leading unit 5b connected with the connection portion 70 on the lateral wall 23 of the first substrate 20a and the connection portion 70 on the lateral wall 23 of the second substrate 20b, respectively. Since the leading unit 5b can be formed by bending a flat plate, the bonding material can be disposed on the flat plate before the flat plate is produced to form the leading unit 5b. For example, firstly, the pattern definition of the leading unit 5b is performed on a flat plate. Then, the bonding material can be prefabricated on the flat plate by a printing art, wherein the processes of soldering, re-melting and cleaning are performed at corresponding positions to accomplish the prefabrication of the bonding material. Then, a bending operation is performed to form the prefabricated leading unit 5b. In the embodiment, while the bending operation for the leading unit 5b is performed, the portion configured to form the vertical portion 51 of the leading unit 5b is not strictly vertical with respect to the portion config-ured to form the first horizontal portion 52. In the embodiment, the at least one first leading component 50a and the at least one second leading component 50b of the leading unit 5b both have an end connected to the jointing portion 50c and both have another end shifted outwardly to form an angle A with respect to vertical direction. In that, when the leading unit 5b is inserted into the hollow portion 20c to provide an elastic force against the lateral walls 23, the first leading component 50a and the second leading component 50b of the leading unit 5b abut against the corresponding connection portion 70 of the first substrate 20a and the corresponding connection portion 70 of the second substrate 20b through the prefabricated bonding material, respectively. In the embodiment, the angle is ranged from 1 degree to 15 degrees. Thus, when the leading unit 5b is disposed in the hollow portion 20c of the substrate panel 2a, it ensures that an elastic force of the leading unit 5b is generated to limit the leading unit 5b at a fixed position between the first substrate 20a and the second substrate 20b. It benefits to perform a connection between the connecting portion 70 and the leading unit 5b by a bonding material, such as the solder. In an embodiment, the bonding material required for the combination of the connecting portion 70 and the leading unit 5 can be directly disposed on both sides 51b of the vertical portion 51, as shown in FIG. 12A. In another embodiment, the bonding material such as the solder may be prefabricated in first recesses 51c of both sides 51b of the leading unit 5c to reduce the bump height of the solder, as shown in FIG. 12B. It is convenient for the subsequent assembling process. Certainly, the first recess 51c can also be engaged with the lateral wall 23 of the substrate 20 and connected to the connection portion 70 on the lateral wall 23 of the substrate 20. The present disclosure is not limited thereto. Moreover, in other embodiments, the thickness of the jointing portion 50c of the leading unit 5d (refer to FIGS. 3A and 4A) can be thinned by mechanical cutting or chemical etching in the prefabrication to further simplify the process, as shown in FIG. 12C. However, the present disclosure is not limited thereto.

Figure 13A:
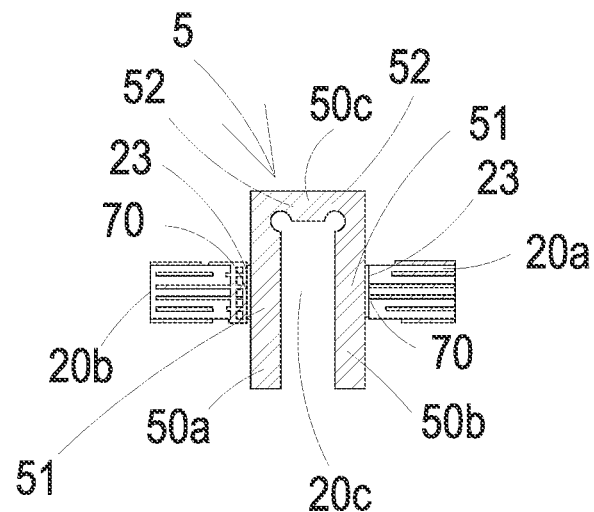
FIG. 13A is a cross-sectional view illustrating a first exemplary assembly of the leading unit and the substrate panel of the present disclosure.
Figure 13B:
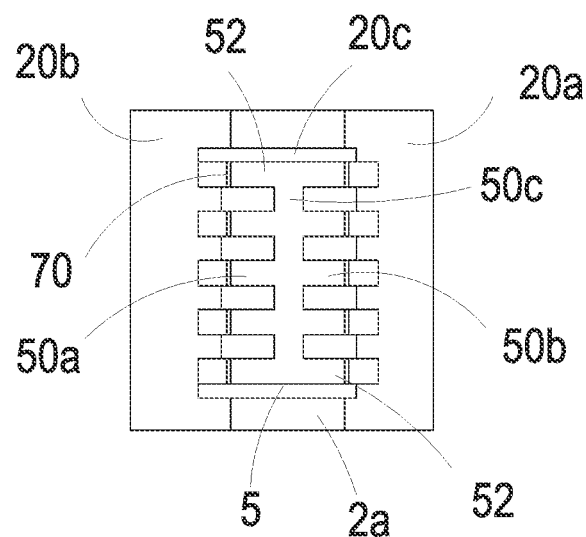
FIG. 13B is a top view illustrating the first exemplary assembly of the leading unit and the substrate panel of the present disclosure.

In addition, when the connection of the leading unit 5 and the connection portion 70 on the lateral wall 23 is performed to produce the power module 1a' by the substrate panel 2a, the structure of the hollow portion 20c is adjustable according to the practical requirements. FIG. 13A is a cross-sectional view illustrating a first exemplary assembly of the leading unit and the substrate panel of the present disclosure. FIG. 13B is a top view illustrating the first exemplary assembly of the leading unit and the substrate panel of the present disclosure. As shown in FIGS. 13A and 13B, the adjacent two of the first substrate 20a and the second substrate 20b are disposed on the same substrate panel 2a and the hollow portion 20c is disposed between the adjacent two of the first substrate 20a and the second substrate 20b. The lateral walls 23 of the first substrate 20a and the second substrate 20b are exposed to the hollow portion 20c to form the connection portions 70, which are corresponding to the first leading component 50a and the second leading component 50b of the leading unit 5. The plurality of first leading components 50a and the plurality of second leading components 50b can be integrated by utilizing the jointing portion 50c, and inserted into the hollow portion 20c together, so that the first leading component 50a and the second leading component 50b are connected to the first substrate 20a and the second substrate 20b at the same time. In an embodiment, the leading unit 5 can be mounted from the bottom up into the hollow portion 20c, and it ensures that the first leading component 50a and the second leading component 50b push against the connection portions 70 on the lateral walls 23 of the first substrate 20a and the second substrate 20b, respectively. It benefits to perform the subsequent soldering process of the connecting portions 70.

Figure 14A:
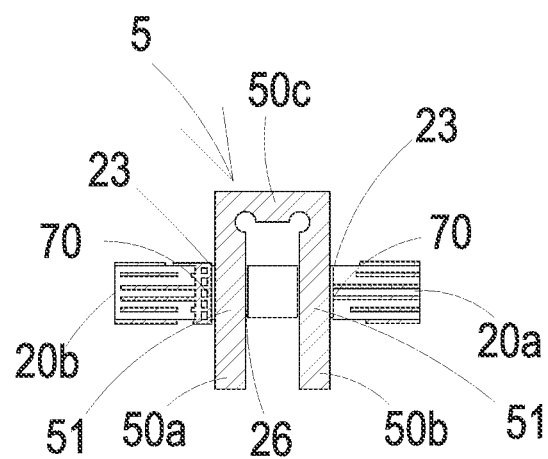
FIG. 14A is a cross-sectional view illustrating a second exemplary assembly of the leading unit and the substrate panel of the present disclosure.
Figure 14B:
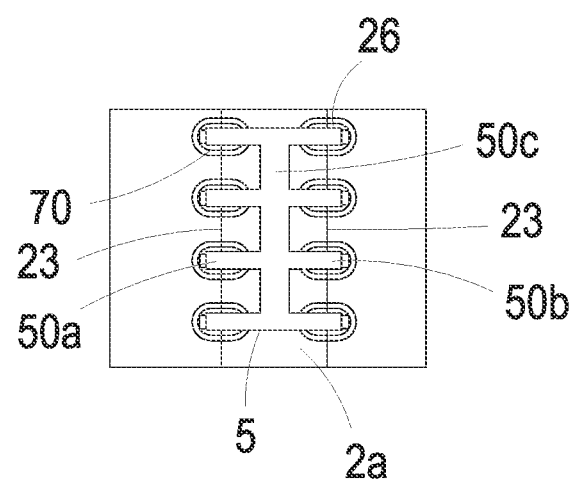
FIG. 14B is a top view illustrating the second exemplary assembly of the leading unit and the substrate panel of the present disclosure.

FIG. 14A is a cross-sectional view illustrating a second exemplary assembly of the leading unit and the substrate panel of the present disclosure. FIG. 14B is a top view illustrating the second exemplary assembly of the leading unit and the substrate panel of the present disclosure. As shown in FIGS. 14A and 14B, in the embodiment, the substrate panel 2a further includes at least two conductive through holes 26, which are configured to form the lateral walls 23 of the adjacent two of the first substrate 20a and the second substrate 20b, respectively, in the subsequent cutting process. The at least two conductive thorough holes 26 may correspondingly receive the vertical portions 51 of the first leading component 50a and the second leading component 50b of the leading unit 5, respectively. The at least two conductive through holes 26 are electrically connected to the vertical portions 51 of the first leading component 50a and the second leading component 50b of the leading unit 5, respectively. Moreover, the at least two conductive through holes 26 are electrically connected to the conductive wire 24 of the first substrate 20a and the conductive wire 24 of the second substrate 20b, respectively. In another embodiment, when the forgoing cutting process is performed to separate the substrate panel 2a to form the first substrate 20a and the second substrate 20b, at least two conductive through holes 26 may be separated to form the connection portion 70 of the first substrate 20a and the connection portion 70 of the second substrate 20b, respectively. Certainly, in other embodiments, one conductive through hole 26 can be configured to receive a plurality of vertical portions 51. With the arrangement of the conductive through hole 26, the accuracy of positioning the vertical portions 51 of the first leading 50a and the second leading component 50b can be enhanced, and it also benefits of increasing the rigidity of the first substrate 20a and the second substrate 20b.

Figure 15:
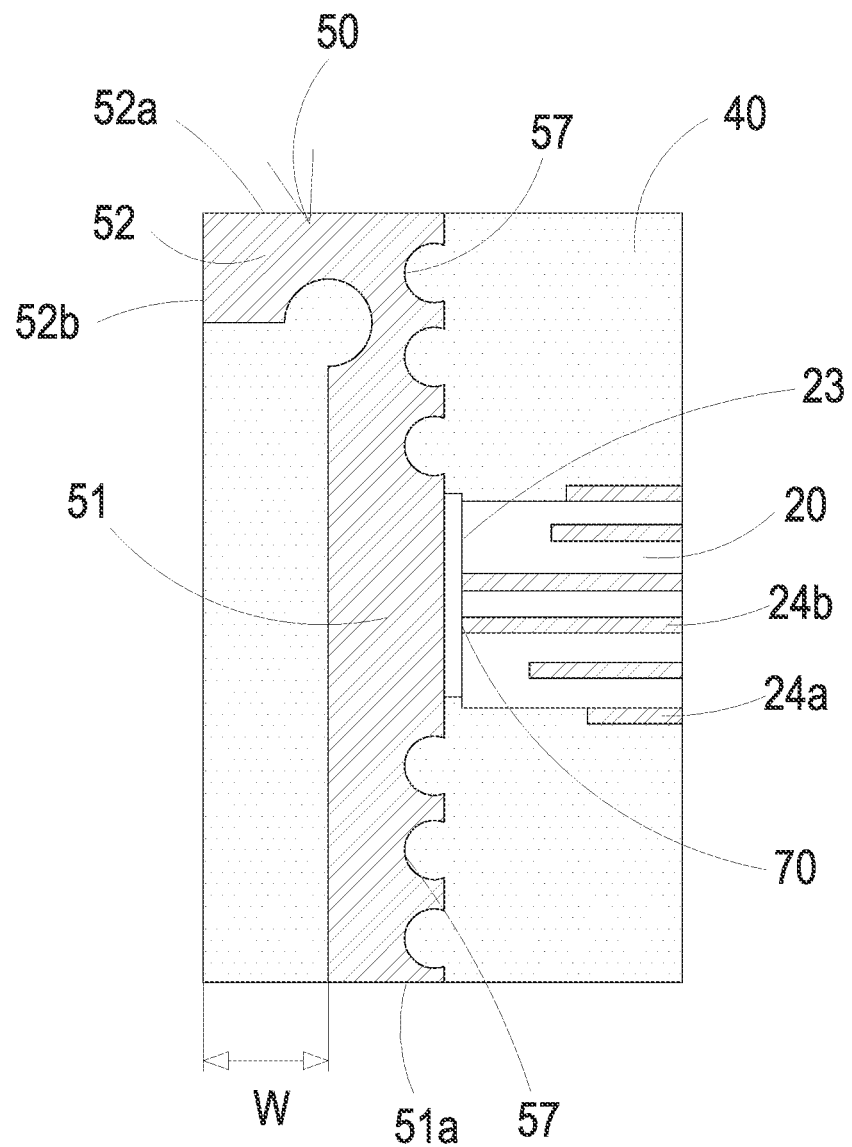
FIG. 15 is a fourth exemplary structure illustrating the connection portion connected between the leading component and the substrate of the present disclosure.

FIG. 15 is a fourth exemplary structure illustrating the connection portion connected between the leading component and the substrate of the present disclosure. As shown in the drawing, the leading component 50 includes a vertical portion 51 and a first horizontal portion 52, and the vertical portion 51 is electrically connected with the conductive wire 24 of the substrate 20 through the connection portion 70. Meanwhile, one lateral side of the vertical portion 51 of the leading component 50 is electrically connected to the conductive wire 24 of the substrate 20 through the connection portion 70. The vertical portion 51 further includes an end connected to the first horizontal portion 52 and another end extended vertically. In the embodiment, the molding component 40 covers the leading component 50 and the substrate 20, but the first contact surface 52a and the second contact surface 52b of the first horizontal portion 52 of the leading component 50 are uncovered by the molding component 40. Furthermore, a third contact surface 51a of the vertical portion 51 of the leading component 50 is also uncovered by the molding component 40. Since the vertical portion 51 is partially embedded in the molding component 40 and has at least one third contact surface 51a, which is uncovered by the molding component 40 and located at the second surface 12 of the power module 1a, the functions such as heat dissipation, structural support or electrical connection can be provided. In addition, the vertical portion 51 further includes at least one second recess 57 disposed on the lateral side of the leading component 50. The molding component 40 covers the vertical portion 51 and the at least one second recess 57 is filled with the molding component 40 for facilitating the molding component 40 to be in close contact with the leading component 50, support and protect the leading component 50. In other embodiments, the second recess 57 can be disposed at any lateral side or bent portion. The arrangement and the number of the second recess 57 are adjustable according to the practical requirements. It is noted that, in the embodiment, the width W of the molding component 40 beyond the vertical portion 51 of the leading component 50 can be for example but not limited to less than 0.5 mm to minimize the size of the power module 1a (refer to FIG. 5). Preferably but not exclusively, in an embodiment, the width W is less than 0.1 mm In other embodiment, the peripheral portion of the molding component 40 can be completely removed by a grinding process. For example, the width W is equal to zero. However, with the arrangement of the second recess 57 to form an uneven structure on the leading component 50, it facilitates the leading component 50 and the molding component 40 to increase the adhesion area and the mechanical attaching effect. It further ensures the reliability of the power module 1a.

Figure 16:
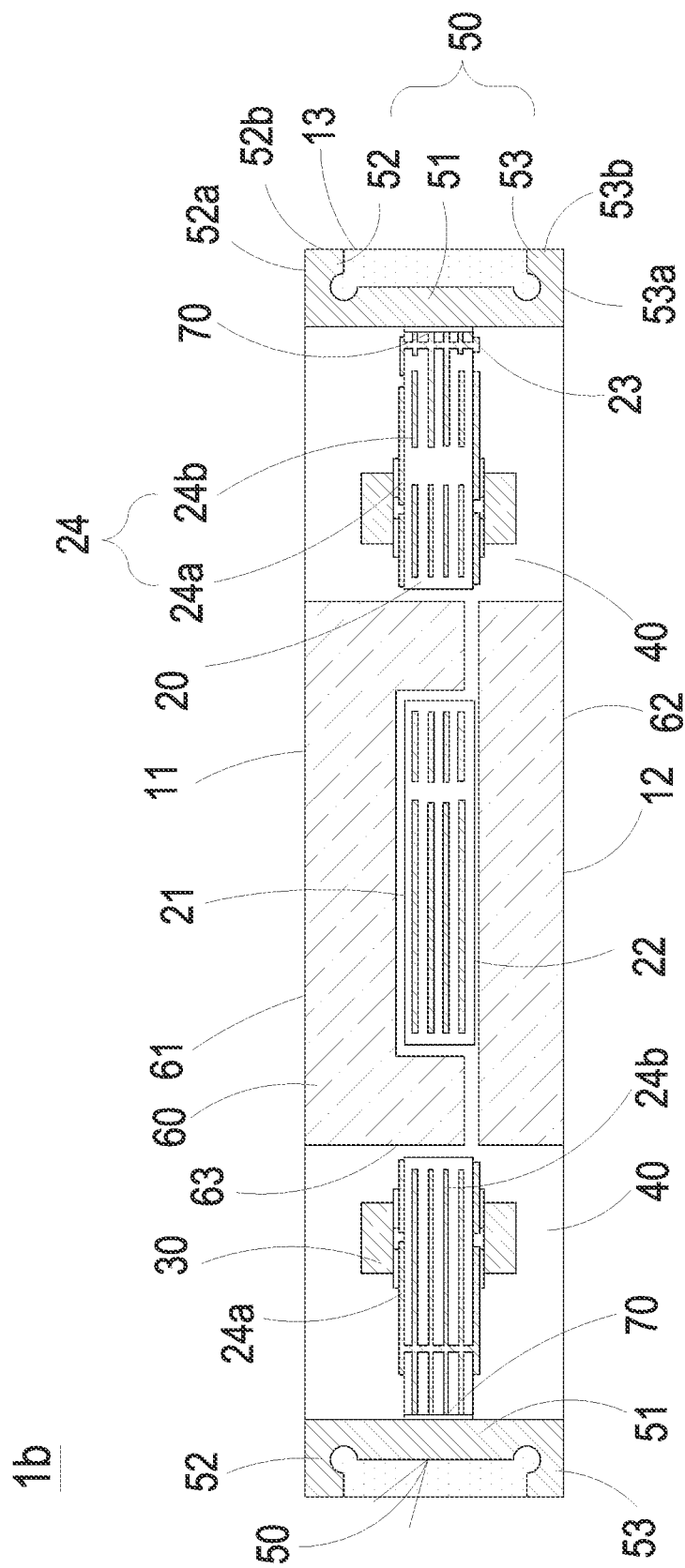
FIG. 16 is a schematic cross-sectional view illustrating a power module according a fourth embodiment of the present disclosure.

FIG. 16 is a schematic cross-sectional view illustrating a power module according a fourth embodiment of the present disclosure. In the embodiment, the structures, elements and functions of the power module 1b are similar to those of the power module 1a of FIG. 5, and are not redundantly described herein. In the embodiment, the power module 1b includes two leading component 50 connected to the substrate 20. Each leading component 50 includes a vertical portion 51, a first horizontal portion 52 and a second horizontal portion 53. The first horizontal portion 52 and the second horizontal portion 53 are connected to the two ends of the vertical portion 51, respectively, and both can have a symmetrical and identical structure, but not limited thereto. In the embodiment, one lateral side of the vertical portion 51 of the leading component 50 is further electrically connected with the conductive wire 24 of the substrate 20 through the connection portion 70. In that, the conductive wire 24 of the substrate 20 can be electrically connected to the leading component 50 at the closest distance. The power module 1b includes a first surface 11, a second surface 12 and a first lateral side 13. The first surface 11 is opposite to the second surface 12. In the embodiment, the second horizontal portion 53 of the leading component 50 further includes a fourth contact surface 53a. The fourth contact surface 53 is uncovered by the molding component 40 and located at the second surface 12 of the power module 1b. In addition, the second horizontal portion 53 of the leading component 50 further includes a fifth contact surface 53b. The fifth contact surface 53b is uncovered by the molding component 40 and located at the first lateral side 13 of the power module 1b. For example, the power module 1b includes the first contact surface 52a disposed on the first horizontal portion 52 and located at the first surface 11, the fourth contact surface 53a disposed on the second horizontal portion 53 and located at the second surface 12, the second contact surface 52b disposed on the first horizontal portion 52 and located at the first lateral side 13, and the fifth contact surface 53b disposed on the second horizontal portion 53 and located at the first lateral side 13. Since the thickness of the leading component 50 is generally larger than the thickness of the first wiring layer 24a or the second wiring layer 24b of the substrate 20, the current-flow capacity and thermal conductivity of the leading component 50 are better, so that the overall electrical/thermal impedance of the power module 1b can be effectively reduced, and the performance of the power module 1b can be improved.

Figure 17:
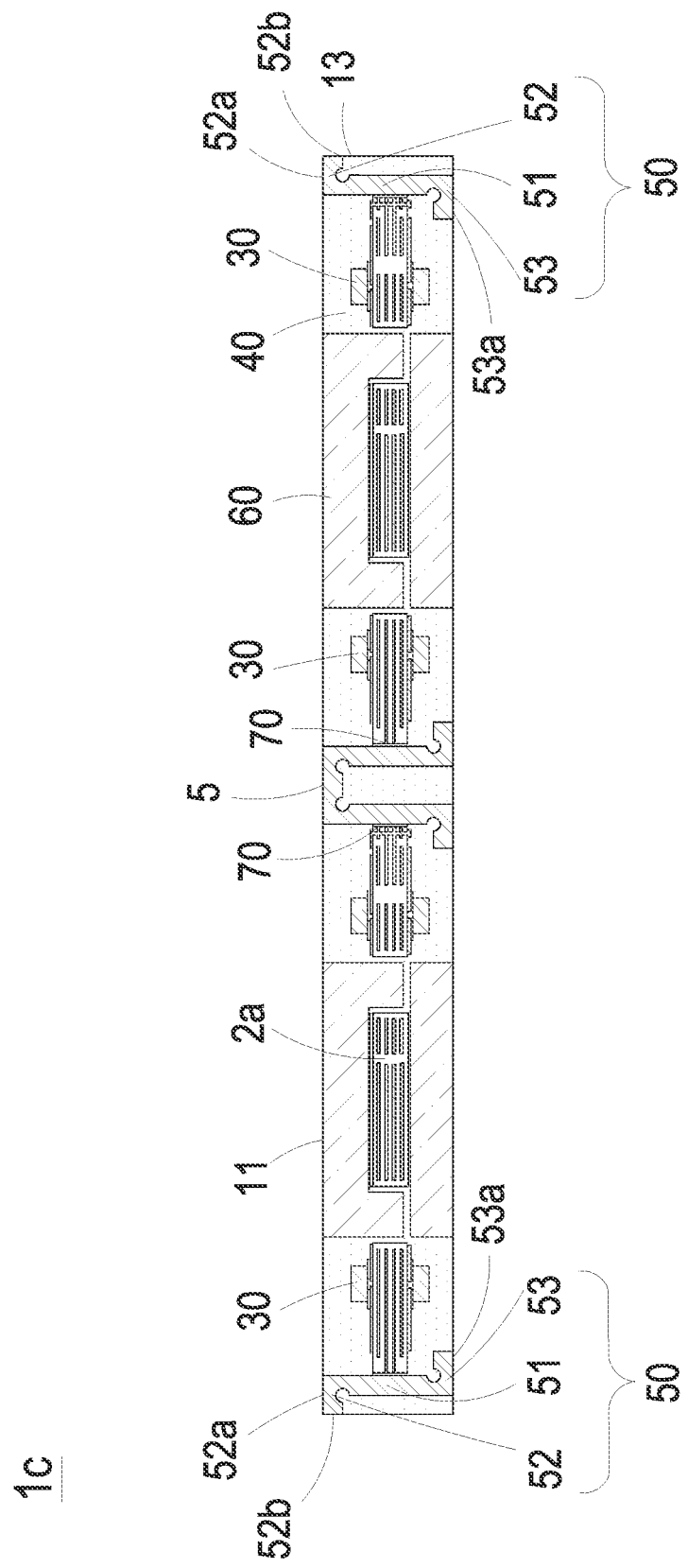
FIG. 17 is a schematic cross-sectional view illustrating a power module according a fifth embodiment of the present disclosure.

FIG. 17 is a schematic cross-sectional view illustrating a power module according a fourth embodiment of the present disclosure. In the embodiment, the structures, elements and functions of the power module 1c are similar to those of the power module 1b of FIG. 16, and are not redundantly described herein. In the embodiment, the power module 1c includes a vertical portion 51, a first horizontal portion 52 and a second horizontal portion 53. The first horizontal portion 52 and the second horizontal portion 53 are connected to the two ends of the vertical portion 51, respectively, and extend in the opposite directions. The first horizontal portion 53 includes a first contact surface 52a and the a second contact surface 52b, which are located at the first surface 11 and the first lateral side 13 of the power module 1c, respectively. The second horizontal portion 53 includes a fourth contact surface 53a, and the fourth contact surface 53a is uncovered by the molding component 40 and located at the second surface 12 of the power module 1c. It is noted that, the second horizontal portion 53 of the leading component 50 further extends toward the inner side of the power module 1c. It benefits not only to increase the entire area of the contact surfaces of the system but also replace a partial space of the molding component 40 by the second horizontal portion 53, so that the power device 30 or other device inside the power module 1c can further reduce the thermal conductive resistance of dissipating the heat toward the system board. Certainly, in the embodiment, in addition to the leading components 50 disposed nearby the two first lateral sides 13, the power module 1c further includes an uncut leading unit 5, which has a horizontal surface 5' configured to form another contact surface. The present disclosure is not limited thereto.

Figure 18:
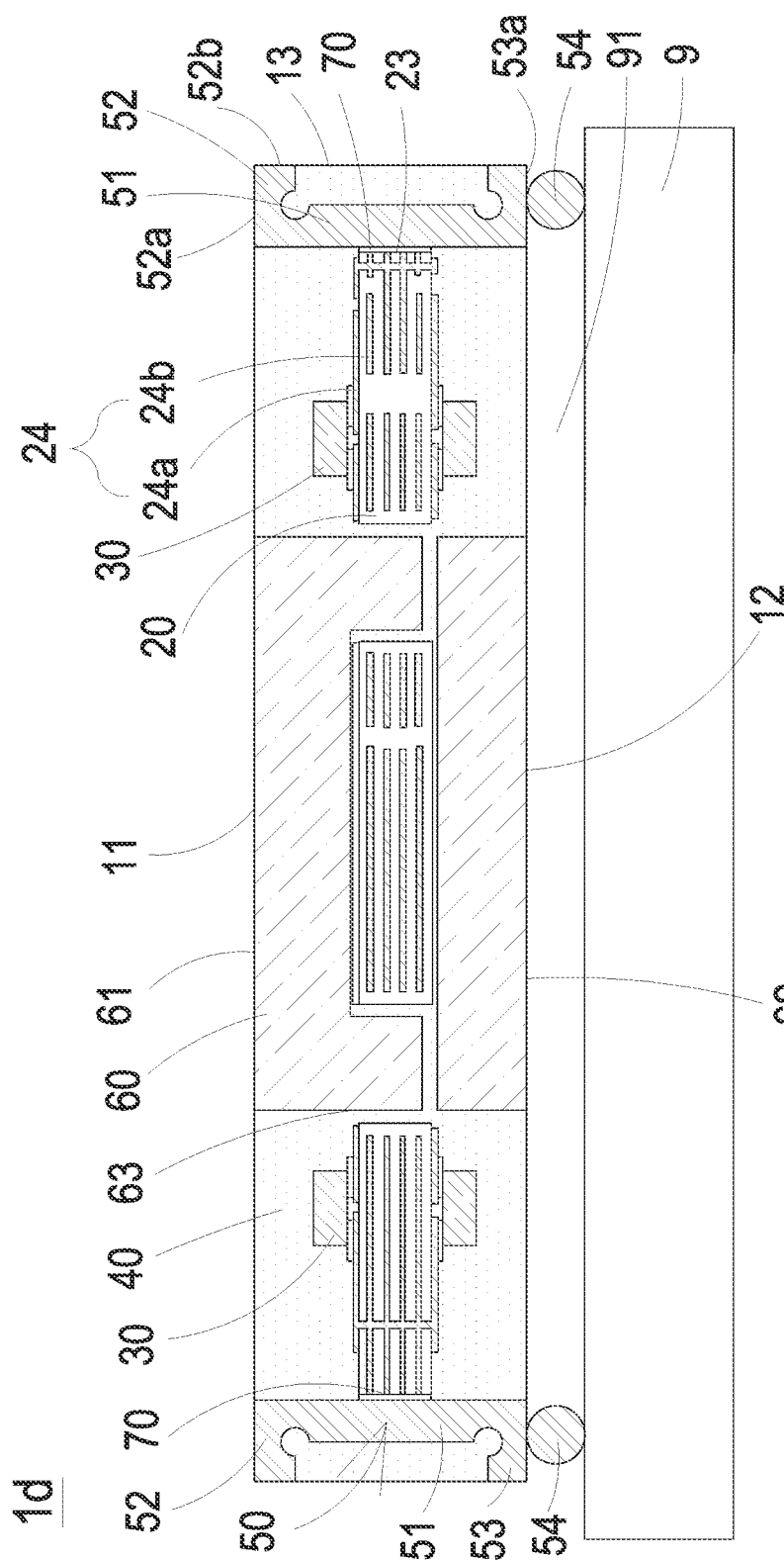
FIG. 18 is a schematic cross-sectional view illustrating a power module according a sixth embodiment of the present disclosure.

FIG. 18 is a schematic cross-sectional view illustrating a power module according a sixth embodiment of the present disclosure. In the embodiment, the structures, elements and functions of the power module 1d are similar to those of the power module 1b of FIG. 16, and are not redundantly described herein. In the embodiment, the power module 1d further includes at least one conductive block 54 disposed on the third contact surface 53a of the second horizontal portion 53 of the leading component 50. The conductive block 54 is made by a homogeneous material. In another embodiment, the conductive block 54 can be made by a heterogeneous material, for example a metal-core solder ball. In other embodiment, the conductive block 54 can be for example a metal conductive block bonded with the third contact surface 53a by an interface material, such as a solder, a sintered silver or a conductive silver paste, and in shape of for example a sphere, a cylinder or a hexahedron. The conductive pad 54 can be used to form an accommodation space 91 between the power module 1d and the system board 9 or other stacked components (not shown). The accommodation space 91 can be used for setting components or assisting heat dissipation. Preferably but not exclusively, in the embodiment, the conductive block 54 is a metal-core solder ball, wherein a solder layer is disposed on the surface of a metal core. The metal core serves to ensure the height, and the solder layer is used for the connection, but the present disclosure is not limited thereto. Moreover, in other embodiments, the conductive block 54 may be disposed on the first contact surface 52a or the second contact surface 52b of the first horizontal portion 52. The present disclosure is not limited thereto, and it is not redundantly described herein.

Figure 19:
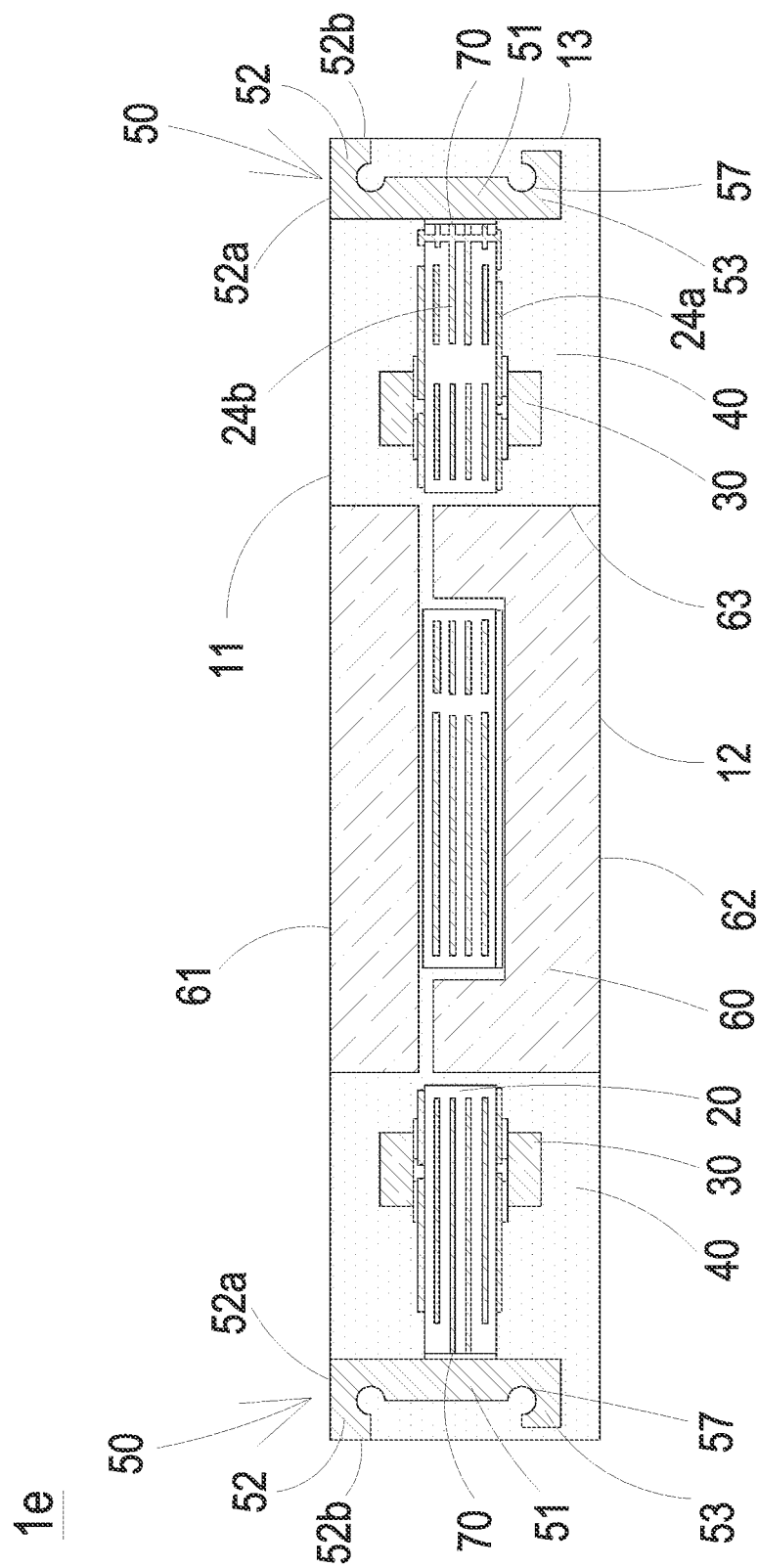
FIG. 19 is a schematic cross-sectional view illustrating a power module according a seventh embodiment of the present disclosure.

FIG. 19 is a schematic cross-sectional view illustrating a power module according a seventh embodiment of the present disclosure; In the embodiment, the structures, elements and functions of the power module 1e are similar to those of the power module 1b of FIG. 16, and are not redundantly described herein. In the embodiment, the leading component 50 includes a vertical portion 51, a first horizontal portion 52 and a second horizontal portion 53, and is electrically connected with the conductive wire 24 of the substrate 20 through the connection portion 70. Different from the above embodiments, in the embodiment, the leading component 50 has the first contact surface 52a and the second contact surface 52b of the first horizontal portion 52, which are uncovered and located at the first surface 11 and the first lateral side 13 of the power module 1e, respectively. The second horizontal portion 53 of the leading component 50 is completely covered by the molding component 40. It is noted that, in the embodiment, the smaller the distance between the second horizontal portion of the leading component 50 and the second surface 12 of the power module 1e, the better it should be from thermal point of view, still the thickness should meet the requirement of isolation voltage. In that, the heat can be conducted to the surface effectively and it benefits of heat-dissipation of the power module 1e. Certainly, the present disclosure is not limited thereto.

Figure 20:
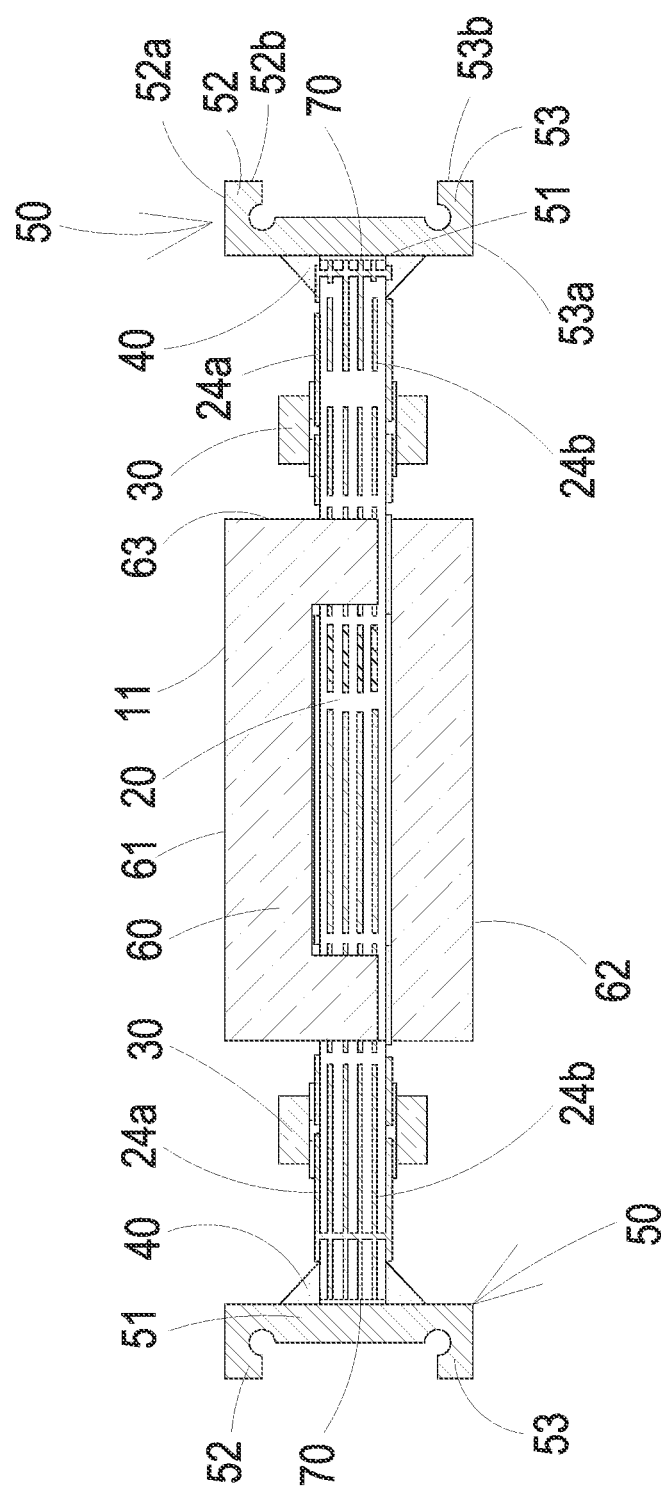
FIG. 20 is a schematic cross-sectional view illustrating a power module according an eighth embodiment of the present disclosure.

FIG. 20 is a schematic cross-sectional view illustrating a power module according an eighth embodiment of the present disclosure. In the embodiment, the structures, elements and functions of the power module 1f are similar to those of the power module 1a of FIG. 5, and are not redundantly described herein. In the embodiment, the molding component 40 covers a part of the vertical portion 51 of the leading component 50 and a part of the substrate 20, so as to reduce the weight of the power module 1f. Moreover, the magnetic component 60 and the leading component 50 can provide the power module 1f with a sufficient structural support.

Figure 21:
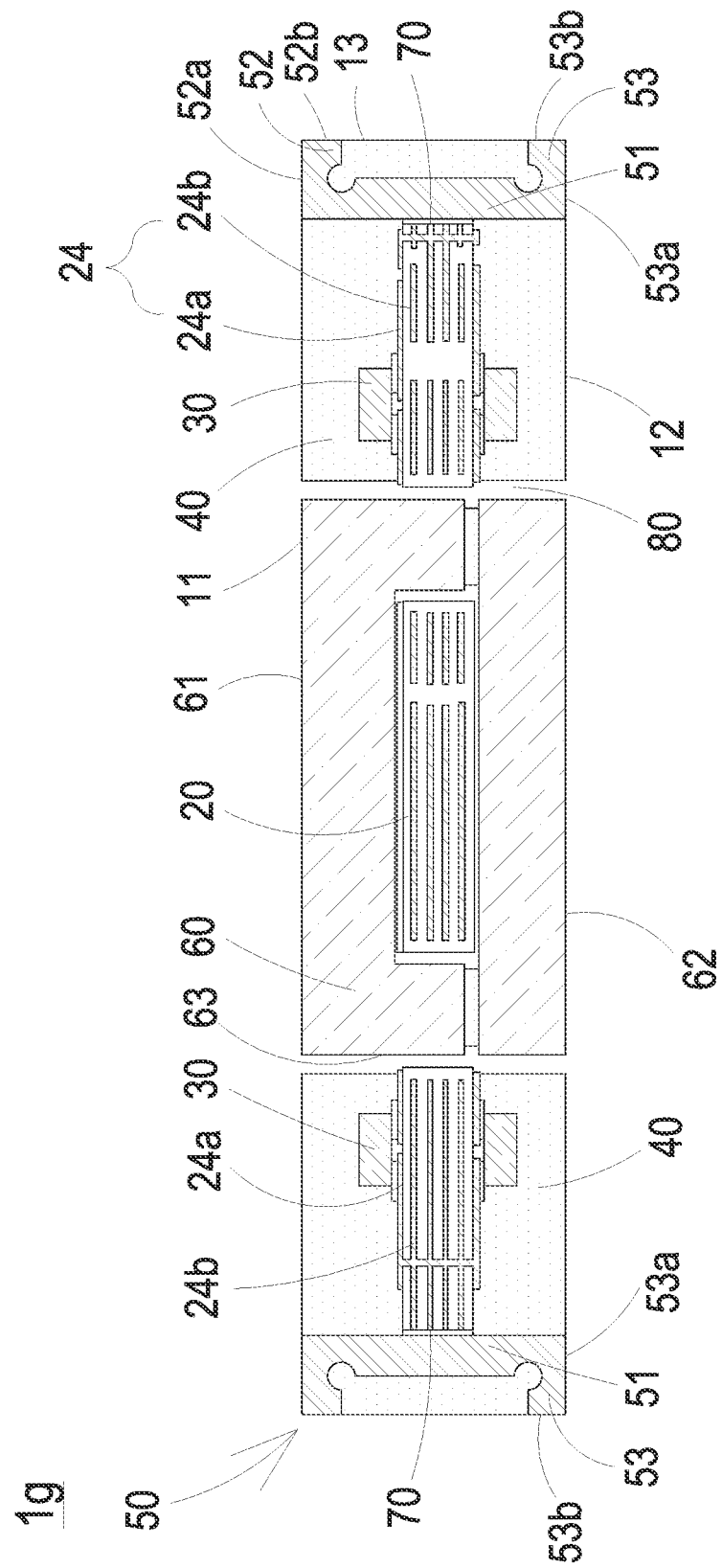
FIG. 21 is a schematic cross-sectional view illustrating a power module according a ninth embodiment of the present disclosure.

FIG. 21 is a schematic cross-sectional view illustrating a power module according a ninth embodiment of the present disclosure; and in the embodiment, the structures, elements and functions of the power module 1g are similar to those of the power module 1b of FIG. 16, and are not redundantly described herein. In the embodiment, the molding component 40 covers the power device 30 on the substrate 20 and the leading component 50 merely. The sidewalls 63 of the magnetic component 60 are unattached by the molding component 40, and there are gaps 80 formed between the magnetic component 60 and the molding component 40. Thus, the magnetic component 60 can be implemented by a magnetic core, which is lower loss and more sensitive to stress, to ensure the power module 1g maintain higher efficiency.

Figure 22:
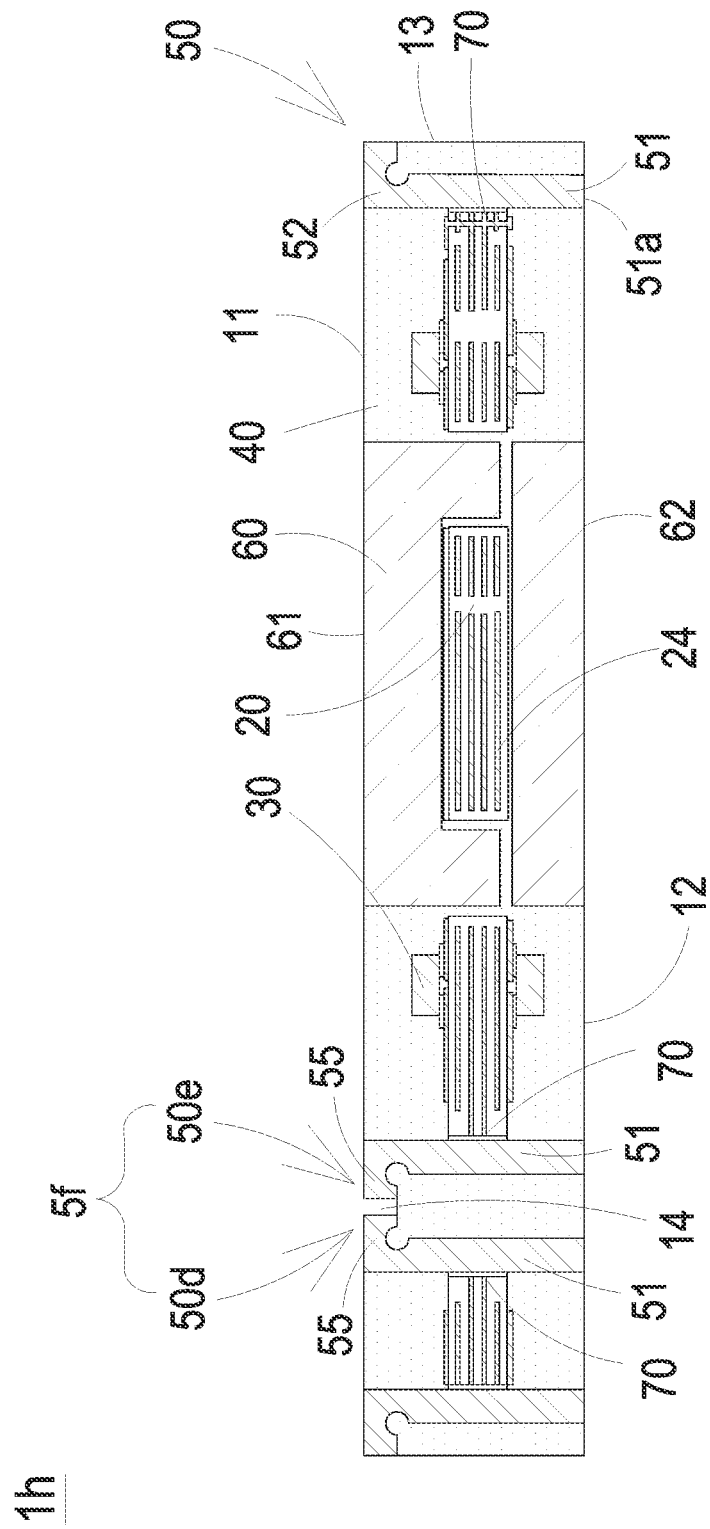
FIG. 22 is a schematic cross-sectional view illustrating a power module according a tenth embodiment of the present disclosure.

FIG. 22 is a schematic cross-sectional view illustrating a power module according a tenth embodiment of the present disclosure. In the embodiment, the structures, elements and functions of the power module 1h are similar to those of the power module 1b of FIG. 16, and are not redundantly described herein. In the embodiment, the power module 1h can be fabricated by a manufacturing process similar to that disclosed in FIGS. 2A to 2D or FIGS. 10A to 10D. Please refer to FIGS. 10A to 10D and 22. In the embodiment, the leading units 5 with the same structure in the above embodiments are configured not only to form the leading components 50 disposed nearby the first lateral sides 13, but also to form an embedded leading unit 5f disposed on one of the first substrate 20a and the second substrate 20b (refer to FIG. 12B). The embedded leading unit 5f includes at least two of a third leading component 50d and a fourth leading component 50e adjacent to each other. The third leading component 50d and the fourth leading component 50e both include a third horizontal portion 55 and a vertical portion 51. The third horizontal portions 55 of the third leading component 50d and the fourth leading component 50e are electrically connected to the conductive wires 24 disposed on one of the first substrate 20a and the second substrate 20b through the vertical portions 51, respectively. Similarly, when the molding layer 40' is formed, the molding layer 40' covers at least parts of the third leading component 50d and the fourth leading component 50e. When the embedded leading unit 5f identical to the leading unit 5 is cut by a process such as a mechanical cutting or a chemical etching, the molding component 40 formed by the molding layer 40' is maintained to cover the vertical portions 51 of the third leading component 50d and the fourth leading component 50e. The third horizontal portion 55 of the third leading component 50d and the third horizontal portion 55 of the fourth leading component 50e are corresponding to each other and configured to define at least one recess 14. Thereby, the third horizontal portions 55 of the third leading component 50d and the fourth leading component 50e can further provide the power module 1h with other contact surfaces as the lead-out components at the intermediate portion of the substrate 20. Certainly, the present disclosure is not limited thereto, and not redundantly described herein.

According to the above various embodiments, in the present disclosure, by optimizing the leading component 50 and the leading unit 5 of the power module 1, the first surface 11, the second surface 12, the first lateral side 13 and the recess 14 of the power module 1 can be utilized to form the first contact surface 52a, the second contact surface 52b, the third contact surface 51a, the fourth contact surface 53a, the fifth contact surface 53b and the horizontal surface 5' to achieve the stable conduction. At the same time, it benefits of simplifying the process and improving the power density and the product reliability. It is emphasized that the shape, the number, the combination and the arrangement of the leading components 50 and the leading units 5 can be adjustable according to the practical requirements. The present disclosure is not limited thereto, and not redundantly described herein.

From the above descriptions, the present disclosure provides a power module and a manufacturing method thereof. By optimizing the leading components on the side edges of the substrate to provide good conduction performance for the power device, the power module can achieve stable conduction, thereby meeting the requirement of high power density and avoiding the power loss or breaking of leading wire on the side edges of substrate at the same time. It further improves the competitiveness of the power module. In addition, by prefabricating at least two leading components into a one-piece leading unit, it is advantageous to integrate and simplify the manufacturing process of the power module and the purposes of enhancing structural stability and reducing manufacturing costs are achieved at the same time.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a power module, comprising steps of:

(a) providing a substrate panel, wherein the substrate panel comprise a plurality of substrates and the plurality of substrates are arranged in an array, wherein each substrate comprises a first side, a second side and a conductive wire, and the first side and the second side are opposite to each other, wherein the plurality of substrates comprises a first substrate and a second substrate;

(b) providing at least one leading unit and a plurality of power devices disposed on the substrate panel, wherein the plurality of power devices are disposed on and corresponding to the plurality of substrates, and each power device is electrically connected with the conductive wire of the corresponding substrate, wherein the at least one leading unit comprises at least two of a first leading component and a second leading component connected adjacent to each other, and the first leading component and the second leading component both comprise a first horizontal portion and a vertical portion, wherein the first horizontal portions of the first leading component and the second leading component are electrically connected to the conductive wires of the adjacent two of the first substrate and the second substrate through the corresponding vertical portions, respectively;

(c) forming a molding layer disposed on the substrate panel to cover at least portion of the first leading component and at least portion of the second leading component; and (d) separating the substrate panel, the at least one leading unit and the molding layer, wherein the molding layer is separated into a plurality of molding components, and the first leading component and the second leading component are separated.

2. The manufacturing method according to claim 1, wherein the at least one leading unit of the step (b) further comprises a joint portion connected between the first horizontal portion of the first leading component and the first horizontal portion of the second leading component to form a horizontal surface on the leading unit.

3. The manufacturing method according to claim 2, wherein the joint portion is removed in the step (d) by a mechanical cutting or a chemical etching process to separate the at least one leading unit to form the first leading component, the second leading component and at least two separated surfaces, wherein the horizontal surface of the leading unit is separated to form the first contact surface of the first leading component and the first contact surface of the second leading component, wherein the at least two separated surfaces are separated to form the second contact surface of the first leading component and the second contact surface of the second leading component.

4. The manufacturing method according to claim 1, wherein the first substrate and the second substrate comprise two opposite lateral walls to form a hollow portion, and the first substrate and the second substrate both comprise a connection portion, wherein the first leading component and the second leading component of the at least one leading unit in the step (b) are inclined outwardly at an angle respectively, wherein the at least one leading unit disposed on the substrate panel in the step (b) is inserted into the hollow portion to provide an elastic force against the two lateral walls, thereby the vertical portions of the first leading component and the second leading component of the at least one leading unit abutting against the corresponding connection portions of the first substrate and the second substrate, respectively.

5. The manufacturing method according to claim 1, wherein the first substrate and the second substrate in the step (b) further comprises at least two conductive through holes, wherein in the step (b) the vertical portions of the first leading component and the second leading component are received within the at least two conductive through holes, respectively, wherein the at least two conductive through holes are electrically connected to the conductive wires of the first substrate and the second substrate, respectively.

6. The manufacturing method according to claim 1, wherein the step (b) further comprises a step of (b1) providing a plurality of magnetic components disposed on the substrate panel, wherein the plurality of magnetic components are disposed on and corresponding to the plurality of substrates, and each magnetic component is located through the corresponding substrate.

7. The manufacturing method according to claim 1, wherein the step (b) further comprises a step of (b2) providing an embedded leading unit disposed on one of the first substrate and the second substrate, wherein the embedded leading unit comprises at least two of a third leading component and a fourth leading component adjacent to each other, and the third leading component and the fourth leading component both comprise a third horizontal portion and a vertical portion, wherein the third horizontal portions of the third leading component and the fourth leading component are electrically connected to the conductive wires disposed on the first substrate and/or the second substrate through the corresponding vertical portions of the third leading component and the fourth leading component, respectively, wherein the molding layer in the step (c) covers at least portion of the third leading component and at least portion of the fourth leading component; wherein the embedded leading unit is separated in the step (d) and the molding component separated from the molding layer covers the vertical portions of the third leading component and the fourth leading component, respectively, wherein the third horizontal portions of the third leading component and the fourth leading component are opposite to each other and configured to define at least one recess.

\* \* \* \* \*